(12) United States Patent
Demizu et al.

(10) Patent No.: US 9,262,580 B2
(45) Date of Patent: Feb. 16, 2016

(54) SUPPORT METHOD AND APPARATUS

(75) Inventors: Kouji Demizu, Kawasaki (JP);
Masayuki Kidera, Kawasaki (JP);
Naoyuki Nozaki, Kawasaki (JP);
Yukihiko Furumoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 784 days.

(21) Appl. No.: 13/420,963

(22) Filed: Mar. 15, 2012

(65) Prior Publication Data
US 2012/0239352 A1 Sep. 20, 2012

(30) Foreign Application Priority Data

Mar. 18, 2011 (JP) .................................. 2011-061040

(51) Int. Cl.
*G06F 17/50* (2006.01)
(52) U.S. Cl.
CPC .................. *G06F 17/5086* (2013.01)
(58) Field of Classification Search
CPC ................................................. G06F 17/5086
USPC ............................................................ 703/1
See application file for complete search history.

(56) References Cited

U.S. PATENT DOCUMENTS

| | | | |
|---|---|---|---|
| 6,968,289 B1 * | 11/2005 | Tsuchiya et al. ............... 702/155 |
| 7,480,596 B2 | 1/2009 | Hashima et al. | |
| 7,990,376 B2 | 8/2011 | Demizu et al. | |
| 8,041,544 B2 | 10/2011 | Demizu et al. | |
| 8,239,174 B2 * | 8/2012 | Demizu et al. .................... 703/1 |
| 8,301,424 B2 * | 10/2012 | Kidera et al. ...................... 703/6 |
| 8,370,116 B2 * | 2/2013 | Kidera et al. ...................... 703/1 |
| 2005/0240383 A1 * | 10/2005 | Hashima et al. .................. 703/7 |
| 2009/0063114 A1 | 3/2009 | Demizu et al. | |
| 2009/0265145 A1 | 10/2009 | Demizu et al. | |
| 2009/0276194 A1 | 11/2009 | Kidera et al. | |
| 2010/0305908 A1 | 12/2010 | Kidera et al. | |

FOREIGN PATENT DOCUMENTS

| | | |
|---|---|---|
| JP | 2009-076033 | 4/2009 |
| JP | 2009-086842 | 4/2009 |

(Continued)

OTHER PUBLICATIONS

Lamiraux et al. (Path planning for elastic plates under manipulation constraints); Robotics and Automation, Proceedings. 1999 IEEE International Conference; 1999; pp. 151-156.*

(Continued)

*Primary Examiner* — Hugh Jones
(74) *Attorney, Agent, or Firm* — Fujitsu Patent Center

(57) ABSTRACT

The disclosed method includes: first generating, from data of a plurality of parts that are string-shaped or band-shaped parts formed by end surfaces and side surfaces, first data including control point candidate data for control point candidates within the end surfaces, end surface data defining the end surfaces and path candidate data for path candidates between the control point candidates, for each of the plurality of parts; second generating second data of continuous shape paths representing continuous parts by searching the first data for parts having same control point candidate data and same end surface data; and third generating third data including data of control points determined on end surface portion of the parts and data of paths between the control points for the continuous shape paths and a group of the continuous shape paths from the first data and the second data.

12 Claims, 25 Drawing Sheets

(56) References Cited

FOREIGN PATENT DOCUMENTS

| JP | 2010-108060 | 5/2010 |
|----|-------------|--------|
| JP | 2010-277115 | 12/2010 |
| WO | WO-2004/025522 | 3/2004 |
| WO | WO-2008/041362 | 4/2008 |
| WO | WO-2008/084516 | 7/2008 |
| WO | WO-2008/084517 | 7/2008 |
| WO | WO-2009/001403 | 12/2008 |

OTHER PUBLICATIONS

Moll et al. (Path planning for deformable linear objects); Robotics, IEEE Transactions; Aug. 2006; pp. 625-636.*
Anon: I-deas 10 NX Series; Product Brief; UGS PLM Solutions, an EDS company; 2004, 65 pages.*
Anon 2: NX I-deas Harness Design Capabilities for modeling wire harness and cables; Siemens product brief; 2007; pp. 1-2.*
"I-DEAS Harness Design", Siemens PLM Software, http://www.ugs.jp/product/nx/harness.html, 2010, pp . 1-2.

* cited by examiner

Harness1

| CONTROL POINT NO. | CONTROL POINT POSITION | | | CONTROL POINT ATTITUDE | | | SECTION LENGTH | OFFSET VALUE(X,Y,Z) FROM CONTROL POINT POSITION, SHAPE PATH LENGTH, DIAMETER |
|---|---|---|---|---|---|---|---|---|
| | X | Y | Z | RX | RY | RZ | | Section1 |
| c1 | 10 | 0 | 0 | 0 | 0 | 0 | 20 | 0, 0, 0, 20, 2 |
| c2 | 10 | 0 | 20 | 0 | 0 | 0 | 30 | 0, 0, 0, 30, 2 |
| c3 | 5 | 0 | 40 | 0 | 1 | 0 | 15 | 0, 0, 0, 15, 2 |
| c4 | -10 | 0 | 40 | 0 | 1 | 0 | 0 | 0, 0, 0, 0, 2 |

| MODEL NAME | STARTING POINT POSITION | | | STARTING POINT ATTITUDE | | | ENDING POINT POSITION | | | ENDING POINT ATTITUDE | | | DIAMETER | SHAPE PATH LENGTH |
|---|---|---|---|---|---|---|---|---|---|---|---|---|---|---|
| | X | Y | Z | RX | RY | RZ | X | Y | Z | RX | RY | RZ | | |
| Model1 | 10 | 0 | 0 | 0 | 0 | 0 | 10 | 0 | 20 | 0 | 0 | 0 | 2 | 20 |
| Model2 | 10 | 0 | 20 | 0 | 0 | 0 | 5 | 0 | 40 | 0 | 0 | 0 | 2 | 30 |
| Model3 | 5 | 0 | 40 | 0 | 1 | 0 | -10 | 0 | 40 | 0 | 1 | 0 | 2 | 15 |
| Model4 | 5 | 50 | 0 | 0 | 0 | 0 | 5 | 50 | 30 | 0 | 0 | 0 | 1 | 30 |
| Model5 | 5 | 49 | 0 | 0 | 0 | 0 | 5 | 49 | 30 | 0 | 0 | 0 | 1 | 30 |
| Model6 | 5 | 49.5 | 30 | 0 | 0 | 0 | 5 | 49.5 | 100 | 0 | 0 | 0 | 4 | 70 |
| Model7 | 5 | 50 | 100 | 0 | 0 | 0 | 5 | 50 | 120 | 0 | 0 | 0 | 1 | 20 |
| Model8 | 5 | 49 | 100 | 0 | 0 | 0 | 5 | 49 | 120 | 0 | 0 | 0 | 1 | 20 |
| Model9 | 5 | 50 | 120 | 0 | 0 | 0 | 5 | 60 | 150 | 0 | 0 | 0 | 1 | 40 |
| Model10 | 5 | 49 | 120 | 0 | 0 | 0 | 5 | 39 | 140 | 0 | 0 | 0 | 1 | 30 |
| Model11 | 10 | 40 | -20 | 0 | 0 | 0 | 10 | 49 | 0 | 0 | 0 | 0 | 1 | 40 |
| Model12 | 10 | 49 | 0 | 0 | 0 | 0 | 10 | 49 | 60 | 0 | 0 | 0 | 1 | 60 |
| Model13 | 10 | 49 | 60 | 0 | 0 | 0 | 10 | 40 | 80 | 0 | 0 | 0 | 1 | 40 |
| Model14 | 10 | 60 | -15 | 0 | 0 | 0 | 10 | 50 | 0 | 0 | 0 | 0 | 1 | 35 |
| Model15 | 10 | 50 | 0 | 0 | 0 | 0 | 10 | 50 | 60 | 0 | 0 | 0 | 1 | 60 |
| Model16 | 10 | 50 | 60 | 0 | 0 | 0 | 10 | 60 | 75 | 0 | 0 | 0 | 1 | 35 |
| Model17 | 30 | 0 | 0 | 0 | 0 | 0 | 30 | 0 | 100 | 0 | 0 | 0 | 1 | 100 |
| Model18 | 30 | 1 | 0 | 0 | 0 | 0 | 30 | 1 | 100 | 0 | 0 | 0 | 1 | 100 |

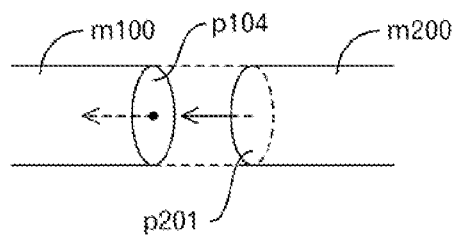
FIG.17
| CONTINUOUS SHAPE PATH | DIAMETER | 1 | 2 | 3 | 4 |
|---|---|---|---|---|---|
| Section1 | 2 | Model1 | Model2 | Model3 | -- |
| Section2 | 1 | Model4 | -- | | |
| Section3 | 1 | Model5 | -- | | |
| Section4 | 4 | Model6 | -- | | |
| Section5 | 1 | Model7 | Model9 | -- | |
| Section6 | 1 | Model8 | Model10 | -- | |
| Section7 | 1 | Model11 | Model12 | Model13 | -- |
| Section8 | 1 | Model14 | Model15 | Model16 | -- |
| Section9 | 1 | Model17 | | | |
| Section10 | 1 | Model18 | | | |
FIG.18
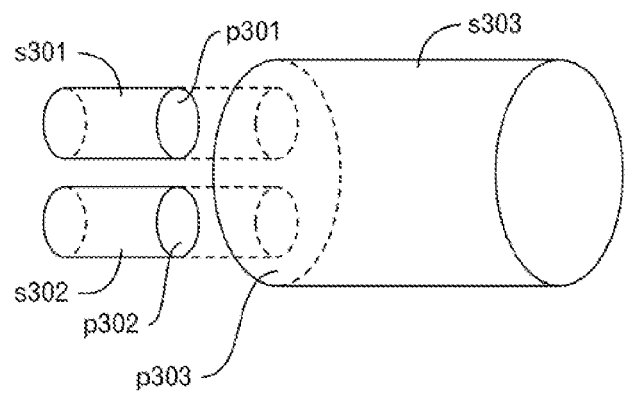
FIG.19

| INCLUSION RELATIONSHIP | ENDING POINT SIDE | STARTING POINT SIDE | INCLUDING SIDE |
|---|---|---|---|
| Inclusion1 | Section2 | Section4 | Section4-start |
| Inclusion2 | Section3 | Section4 | Section4-start |
| Inclusion3 | Section4 | Section5 | Section4-end |
| Inclusion4 | Section4 | Section6 | Section4-end |

FIG.21

| GROUP | INCLUDING SIDE | 1 | 2 | 3 |
|---|---|---|---|---|
| Group1 | Section4-start | Inclusion1 | Inclusion2 | -- |
| Group2 | Section4-end | Inclusion3 | Inclusion4 | -- |

FIG.23

| HARNESS ASSEMBLY | 1 | 2 | 3 |
|---|---|---|---|
| Harness1 | Section1 | -- | -- |
| Harness2 | Group1 | Section4 | Group2 |
| Harness3 | Section7 | -- | |
| Harness4 | Section8 | | |
| Harness5 | Section9 | | |
| Harness6 | Section10 | | |

FIG.24

| MATCHING CONTINUOUS PATH | 1 | 2 | 3 |
|---|---|---|---|
| Equal1 | Section9 | Section10 | – |

| HARNESS ASSEMBLY | 1 | 2 | 3 |
|---|---|---|---|
| Harness1 | Section1 | – | – |
| Harness2 | Group1 | Section4 | Group2 |
| Harness3 | Section7 | – | |
| Harness4 | Section8 | | |
| Harness5 | Equal1 | | |

FIG.32

| | | | | | | | | | Harness2 | | | | |
|---|---|---|---|---|---|---|---|---|---|---|---|---|---|
| CONTROL POINT NO. | CONTROL POINT POSITION | | | CONTROL POINT ATTITUDE | | | SECTION LENGTH | OFFSET VALUE(X,Y,Z) FROM CONTROL POINT, SHAPE PATH LENGTH, DIAMETER | | | | | |
| | X | Y | Z | RX | RY | RZ | | Section2 | Section3 | Section4 | Section5 | Section6 |
| c1 | 5 | 49.5 | 0 | 0 | 0 | 0 | 30 | 0, 0.5, 0, 30, 1 | 0, -0.5, 0, 30, 1 | | | |
| c2 | 5 | 49.5 | 30 | 0 | 0 | 0 | 0 | 0, 0.5, 0, 0, 1 | 0, -0.5, 0, 0, 1 | 0, 0, 0, 70.4 | | |
| c3 | 5 | 49.5 | 100 | 0 | 0 | 0 | - | - | - | 0, 0, 0, 0.4 | 0, 0.5, 0, 20, 1 | 0, -0.5, 0, 20, 1 |
| c4 | 5 | 49.5 | 120 | 0 | 0 | 0 | - | - | - | - | 0, 0.5, 0, 40, 1 | 0, -0.5, 0, 30, 1 |
| c5 | 5 | 60 | 150 | 0 | 0 | 0 | - | - | - | - | 0, 0, 0, 0, 1 | |
| c6 | 5 | 39 | 140 | 0 | 0 | 0 | - | - | - | - | - | 0, 0, 0, 0, 1 |

| BINDING CONTROL POINT NO. | POSITION OF BINDING CONTROL POINT | | | ATTITUDE OF BINDING CONTROL POINT | | | SECTION LENGTH | OFFSET VALUE FROM BINDING CONTROL POINT, CONTROL POINT NO. OF CORRESPONDING HARNESS ASSEMBLY | |
|---|---|---|---|---|---|---|---|---|---|
| | X | Y | Z | RX | RY | RZ | | Harness3 | Harness4 |
| | | | | | | | | Band1 | |
| 1 | 10 | 49.5 | 0 | 0 | 0 | 0 | 30 | 0, 0.5, 0.2 | 0, -0.5, 0.2 |
| 2 | 10 | 49.5 | 60 | 0 | 0 | 0 | --- | 0, 0.5, 0.3 | 0, -0.5, 0.3 |

FIG.36

SUPPORT METHOD AND APPARATUS

CROSS-REFERENCE TO RELATED APPLICATIONS

This application is based upon and claims the benefit of priority of the prior Japanese Patent Application No. 2011-061040, filed on Mar. 18, 2011, the entire contents of which are incorporated herein by reference.

FIELD

This technique relates to a design support technique of string-shaped or band-shaped flexible objects.

BACKGROUND

Currently, three-dimensional CAD (Computer Aided Design) systems are used in the development of various kinds of mechanical products. A three-dimensional CAD system models the shape of a mechanical product by accurately defining that shape mathematically. Because the three-dimensional CAD system mathematically and precisely defines the shape of the mechanical product, the three-dimensional CAD system is able to accurately express the static assembled state, however, on the other hand, is not able to express movement of an object well.

However, in the work of assembling the mechanical product, movement of the parts and units are both involved. Many mechanical products have movable parts. Therefore, the verification that it is able to assemble the mechanical product without any problems and that the movable parts function properly is an important point in the design process. When attempting to use the three-dimensional CAD system to carry out this kind of verification concerning the movable portions, sufficient response speed is often difficult. Therefore, a design verification apparatus such as a digital mockup (DMU) system is now often used.

Similar to the three-dimensional CAD system, a DMU system is a system that generates a product model in the virtual space of the computer, and simulates the functions, ease of assembly, operability and the like of the product. In the DMU system, by greatly improving the operability of the system compared with the three-dimensional CAD system, it is possible to easily perform dynamic verification that involves the movement of the parts and units. By using the DMU system, it becomes possible to discover, in an earlier stage, problems that conventionally were not known without making a prototype.

Currently, in the field related to the three-dimensional CAD and DMU, harness design and verification has gained much attention. A harness is a single or plural electric wires or optical cables that have been processed to form a flexible and deformable part. In order to set the wiring arrangement, it is necessary that both the mechanical design and electrical design be completed to a certain extent, so conventionally, harness design was often postponed until later. Actually, it was often the case that after a prototype was completed, an actual harness was installed in the prototype and the length was adjusted, and problems concerning the harness might be discovered late.

In present-day products in which parts or units are very densely mounted, there is a high possibility that, due to various problems such as having to forcibly bend the harness and poor workability during installation, interference between the harness and other parts or units, major reworking will occur. Therefore, there is a need for harness design and verification to be started at a relatively early stage in the design process.

Recently, some commercially sold three-dimensional CAD systems include functions for supporting harness design. The main objective of these is to carry out modeling by importing design in the electrical system into the three-dimensional CAD system. In other words, the harness shape is created in the three-dimensional CAD system according to a connection list that is created in the design of the electrical system. However, as mentioned above, in the three-dimensional CAD system, dynamically verifying the movement of the harness during assembly or when movable parts move is difficult. Moreover, even when the model of a harness, which was created in the three-dimensional CAD system, is imported into the DMU system, the harness that was created using the three-dimensional CAD system is imported into the DMU system as a rigid body solid model. Therefore, it is not possible to use a simple method to perform verification of the harness as a flexible object in the DMU system.

Incidentally, a technique for performing verification of a harness by defining the harness in a DMU system already exists. In such a DMU system, verification is carried out by defining the harness by the endpoints, the cross sectional shape and the path, and simulating change in the path of the harness when parts and units are moved.

However, because the design of the mechanical products is performed using the three-dimensional CAD system, when a problem concerning the harness is discovered in the DMU system, design changes are performed in the three-dimensional CAD system based on the verification results by the DMU system. However, the design changes using the three-dimensional CAD system while referencing the verification results by the DMU system is very complex work. On the other hand, when performing verification again in the DMU system after the model of the harness has been corrected in the three-dimensional CAD system, a harness is created again in the DMU system.

This becomes very complex work, so preferably it would be possible to convert data from the DMU system to the three-dimensional CAD system, and conversely from the three-dimensional CAD system to the DMU system.

Namely, conventionally, it is impossible to appropriately exchange data of the flexible objects between a design verification apparatus and the three-dimensional CAD system.

SUMMARY

This method includes: first generating, from data of a plurality of parts that are string-shaped or band-shaped parts formed by end surfaces and side surfaces, first data including control point candidate data for control point candidates within the end surfaces, end surface data defining the end surfaces and path candidate data for path candidates between the control point candidates, for each of the plurality of parts; second generating second data of continuous shape paths representing continuous parts by searching the first data for parts having same control point candidate data and same end surface data; and third generating third data including data of control points determined on end surface portion of the parts and data of paths between the control points for the continuous shape paths and a group of the continuous shape paths from the first data and the second data.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 5 is a diagram depicting an example of harness model data;

FIG. 15 is a diagram depicting an example of model position and attitude data;

FIG. 17 is a diagram to explain a continuous shape path;

FIG. 18 is a diagram depicting an example of continuous shape path data;

FIG. 19 is a diagram to explain an inclusion relationship extraction processing;

FIG. 21 is a diagram depicting an example of inclusion relationship data;

FIG. 23 is a diagram depicting an example of group data;

FIG. 24 is a diagram depicting an example of harness assembly data;

FIG. 32 is a diagram depicting an example of the harness model data;

FIG. 36 is a diagram depicting an example of binding control point data; and

DESCRIPTION OF EMBODIMENTS

A system relating to an embodiment of this technique will be explained using FIG. 1. In this embodiment, by generating a rigid three-dimensional solid model and storing that model in a three-dimensional model data storage unit 400, an integrated management of the data of the model to be designed is carried out. On the other hand, when performing design verification of the three-dimensional solid model that is generated in the three-dimensional CAD system 300 and includes a flexible object such as a harness, the three-dimensional CAD system 300 generates an intermediate file according to general intermediate formats such as IGES (Initial Graphics Exchange Specification) and STEP (STandard for the Exchange of Product model data), and stores that file in an intermediate file storage unit 200.

On the other hand, a design verification apparatus 1000 such as the DMU reads the intermediate file in a predetermined format from the intermediate file storage unit 200, and generates, by a harness model constructing unit 1200 of the design verification apparatus 1000, harness model data that is used in the design verification apparatus 1000 when performing verification of a flexible object, and stores that data in a harness model data storage unit 1500.

On the other hand, when returning the harness model in the design verification apparatus 1000 to the three-dimensional CAD system 300, an output data generator 1100 processes the harness model data stored in the harness model data storage unit 1500 to generate an intermediate file such as described above, and stores that file into the intermediate file storage unit 200. When the three-dimensional CAD system 300 reads the intermediate file that is stored in the intermediate file storage unit 200, it becomes possible for the three-dimensional CAD system 300 to use model data in that file as a solid model. As illustrated in FIG. 1, the output data generator 1100 includes a dividing unit 1110.

Figure 2:
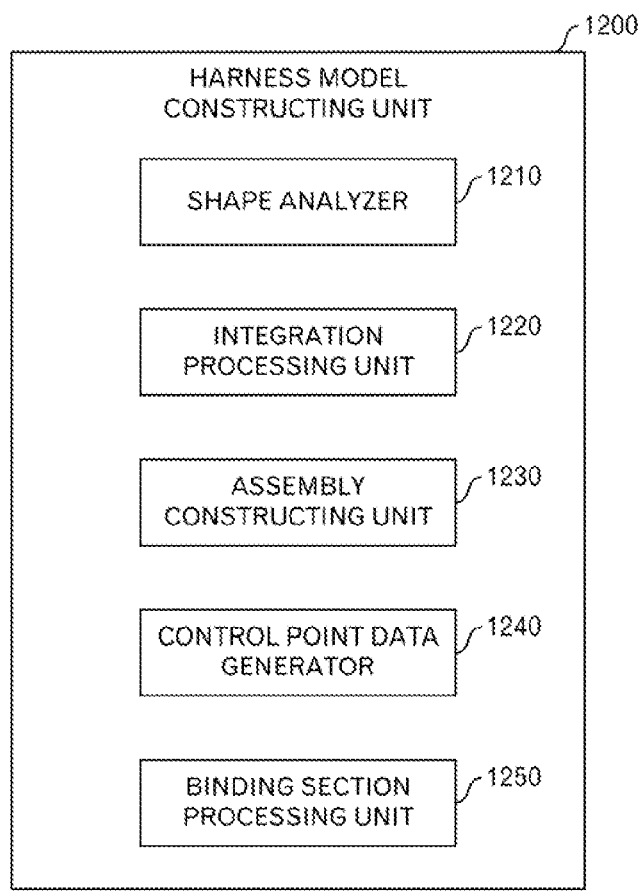
FIG. 2 is a functional block diagram of a harness model constructing unit.

Moreover, the harness model constructing unit 1200 has processing units as illustrated in FIG. 2. The harness model constructing unit 1200 has a shape analyzer 1210, an integration processing unit 1220, an assembly constructing unit 1230, a control point data generator 1240 and a binding section processing unit 1250. These processing units will be explained below using FIG. 3 to FIG. 36 and using the processing flows.

Figure 1:
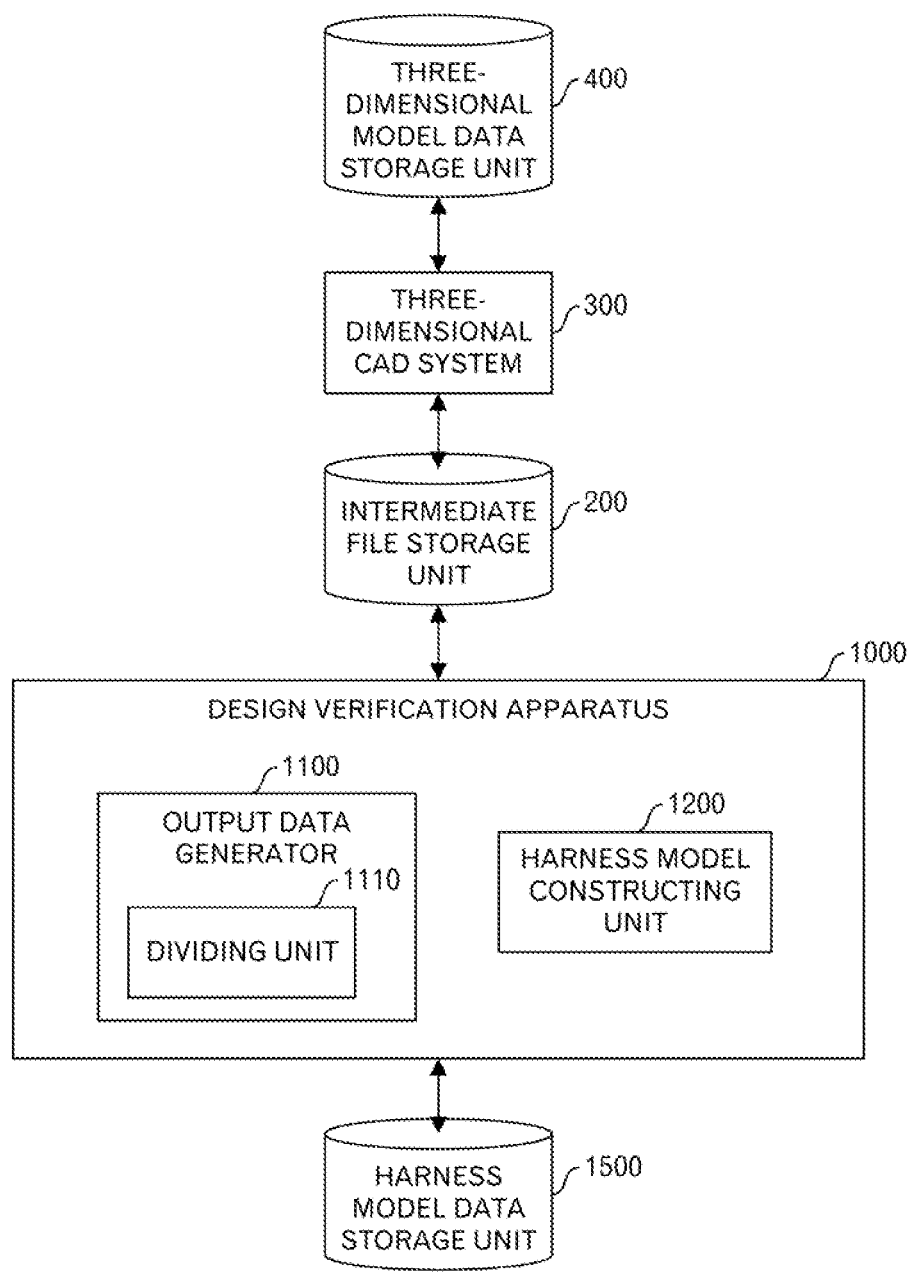
FIG. 1 is a diagram depicting a configuration of a system relating to this embodiment.
Figure 3:
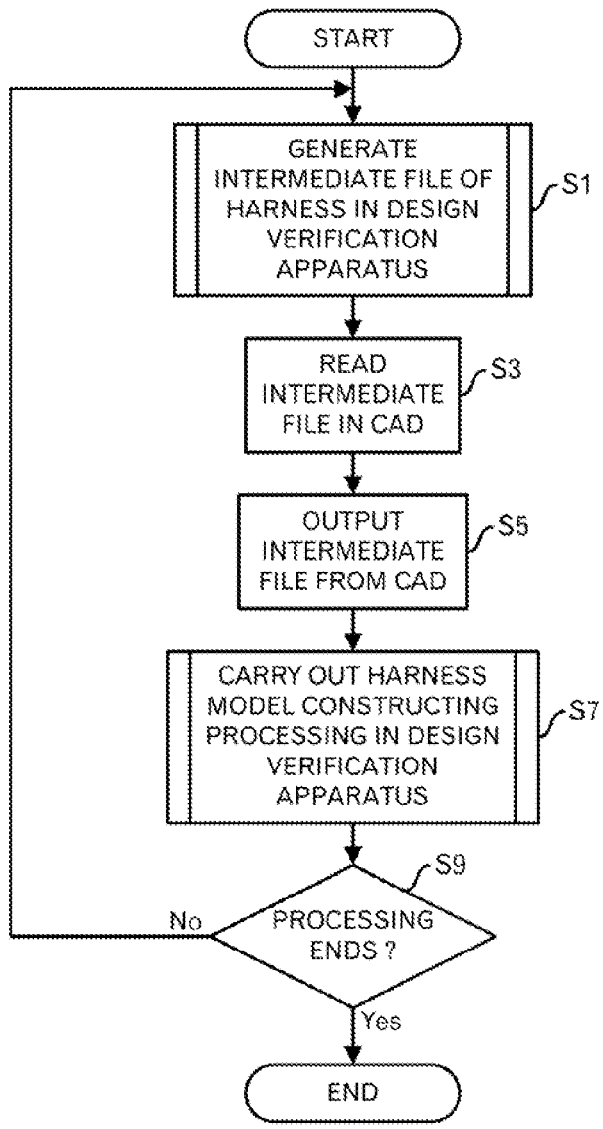
FIG. 3 is a diagram depicting a flow of a processing of the system.

First, the basic processing flow of the system illustrated in FIG. 1 is illustrated in FIG. 3. First, in order to return the harness model in the design verification apparatus 1000 to the three-dimensional CAD system 300, the output data generator 1100 of the design verification apparatus 1000 generates an intermediate file of the harness model that is stored in the harness model data storage unit 1500, and stores that file in the intermediate file storage unit 200 (step S1). This processing will be explained in detail later.

As a result, the three-dimensional CAD system 300 reads the intermediate file from the intermediate file storage unit 200, carries out solid modeling for the data in the intermediate format, which is included in the intermediate file, as was carried out conventionally, and carries out a processing in response to instructions from the designer (step S3). The data is imported into the three-dimensional CAD system 300 as plural parts generated by dividing the string-shaped or band-shaped flexible harness into plural sections. Each part is handled as a four-surface model having a starting point end surface, an ending point end surface, a top surface and a bottom surface.

After the processing in response to the instructions from the designer is complete in the three-dimensional CAD system 300, and when an instruction is given from the designer to output data again to the design verification apparatus 1000, the three-dimensional CAD system 300 generates an intermediate file in the predetermined intermediate format as described above, and stores that file in the intermediate file storage unit 200 (step S5). The processing at this step is the same as in the conventional processing, and the starting point end surface, ending point end surface, top surface and bottom surface are written in the intermediate file for each part, in order conforming with a predetermined rule.

After that, the design verification apparatus 1000 reads the intermediate file from the intermediate file storage unit 200, and the harness model constructing unit 1200 carries out a harness model constructing processing (step S7). This harness model constructing processing will be described in detail below.

The processing described above is repeated until instructed by the designer to end the processing (step S9). Incidentally, the processing may end after the step S3.

In this way, data is returned to the three-dimensional CAD system 300 by using an intermediate file in a typical intermediate format, after which data is integratedly managed on the three-dimensional CAD system side, and because a flexible harness model can be reproduced at anytime from the solid model in the three-dimensional CAD system 300, it is possible to reduce the time required to manage data between different kinds of tools.

Next, the intermediate file generating processing (step S1) will be explained using FIG. 4 to FIG. 7.

Figure 4:
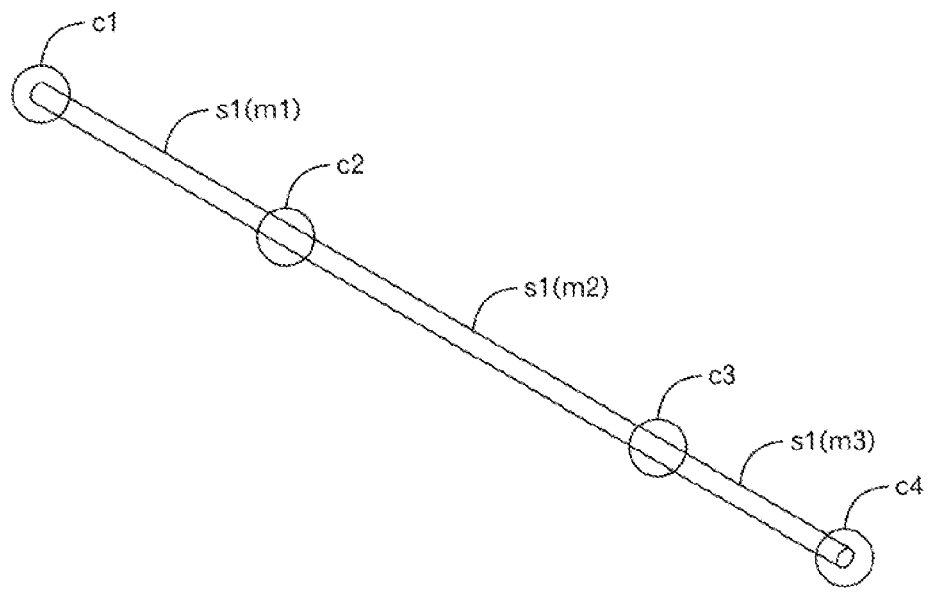
FIG. 4 is a diagram depicting an example of a harness model.

First, it is presumed that there is a harness model as illustrated in FIG. 4. In other words, the harness model is one straight continuous shape path s1 such as will be described below, and is made by combining three original parts m1 to m3. In this case, control points c1 and c4 are set at the centers of gravity of both end surfaces, and a control point c2 for the junction section between part m1 and part m2, and a control point c3 for the junction section between part m2 and part m3 are also provided. The harness model data as illustrated in FIG. 5 is stored in the harness model data storage unit 1500. In the example of FIG. 5, the harness illustrated in FIG. 4 is Harness 1, and for each control point, the coordinates (X, Y, Z) of the control point position, the control point attitude data (RX, RY, RZ), section length, and the offset value (X, Y, Z) from the control point position, shape path length and diameter are registered.

Relative values with respect to a reference direction are registered as the attitude data of the control point. In the case of the example in FIG. 4, the length to the next control point is registered as the section length. In the case that the control point and the center of gravity of the end surface of the continuous shape path are different, a relative value with respect to the control point is registered as the offset value from the control point position.

In the example in FIG. 4, this is "0". Furthermore, the shape path length is the same as the section length in the case of FIG. 4, and is the length to the next control point. The path may be bent, so the length is not simply the straight line distance. The diameter is the diameter of the part on the end surface that includes the control point. Here, because the end surface is a circle, the end surface can be identified by just the diameter, however, in the case where the end surface is not a circle, data to identify the end surface is registered.

Figure 6:
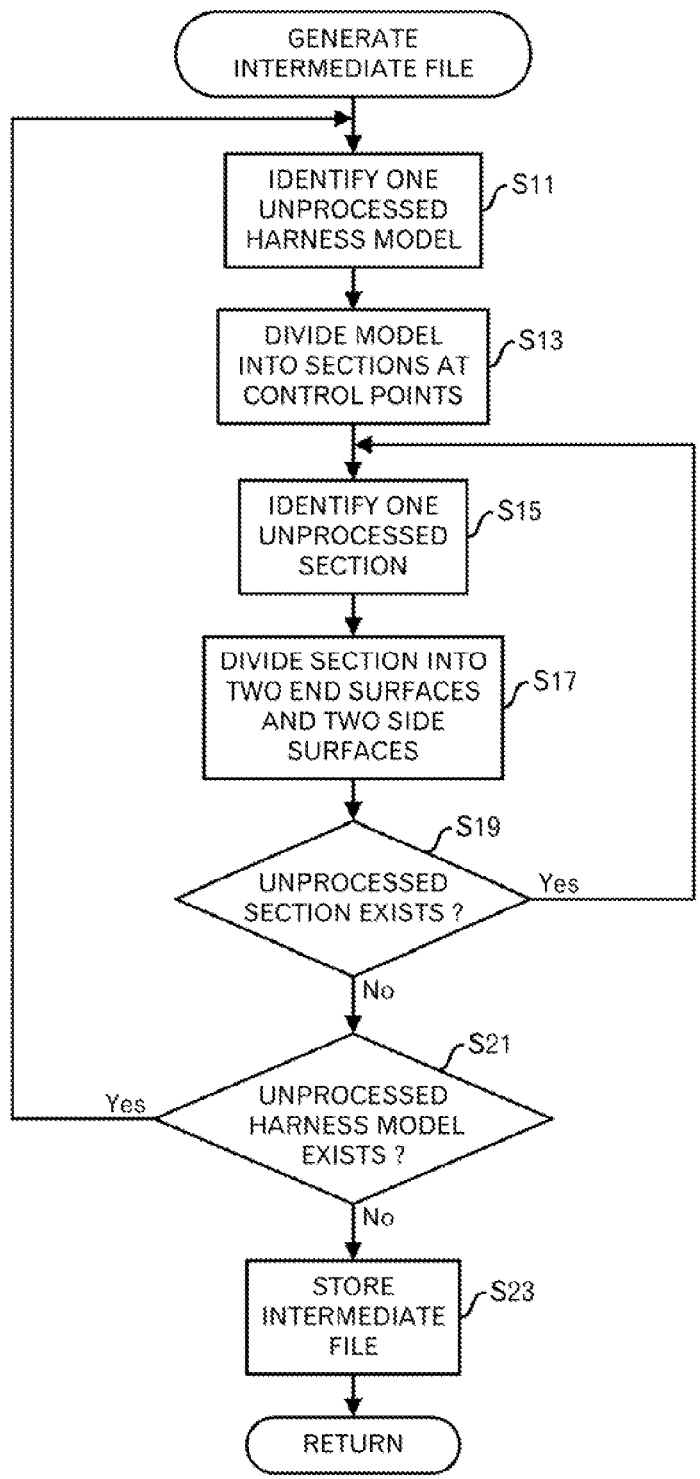
FIG. 6 is a diagram depicting a processing flow of an intermediate file generation processing.

Next, the intermediate file generation processing (step S1) will be explained using FIG. 6. First, the output data generator 1100 identifies one unprocessed harness model in the harness model data storage unit 1500 (FIG. 6: step S11). The dividing unit 1110 of the output data generator 1100 divides the identified harness model into sections at the positions of respective control points (step S13). In the example in FIG. 4, the model is divided into three sections.

Figure 7:
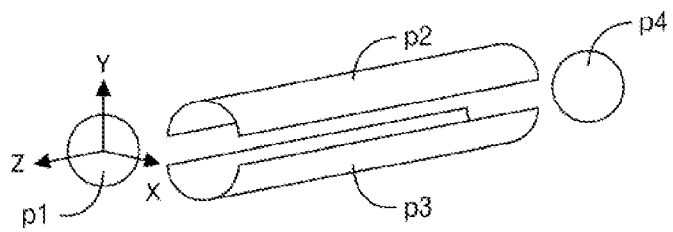
FIG. 7 is a diagram to explain four surfaces of a solid model.

After that, the output data generator 1100 identifies one unprocessed section (step S15). Then, the dividing unit 1110 breaks down the identified section into a starting point end surface, ending point end surface, top surface and bottom surface from the data of the control points to generate data for these, and writes that data in a file in the intermediate format according to a predetermined rule (step S17). More specifically, because the harness model is divided so that the model is a closed solid model such as a column, the harness model is further divided into four surfaces p1 to p4 as illustrated in FIG. 7. When doing this, the normal line from the starting point end surface p1 is identified from attitude data of the control point that is included in the starting point end surface p1, and the normal line from the ending point end surface p4 is identified from the attitude data of the control point included in the ending point end surface p4. Furthermore, the shape of the side surfaces is determined so that the shape path length coincides with the length between control points. Next, the section is divided into a top surface and bottom surface according to the orientation of the coordinate system in which the normal line of the starting point end surface of the control point is positive. For example, as illustrated in FIG. 7, taking the direction of the normal line of the starting point end surface to be the plus Z axis, the top side of the starting point end surface to be the plus side of the Y axis and the bottom side to be the minus side, the side surfaces are divided into a top surface p2 and bottom surface p3. For example, the surfaces are written into the intermediate file in the order of starting point end surface p1, top surface p2, bottom surface p3 and ending point end surface p4. The format follows IGES or STEP as mentioned above.

The output data generator 1100 then determines whether or not there are any unprocessed sections (step S19). When there is an unprocessed section, the processing returns to the step S15. On the other hand, where there are no unprocessed sections, the output data generator 1100 determines whether or not there are any unprocessed harness models (step S21). When there is an unprocessed harness model, the processing returns to the step S11. On the other hand, when there are no unprocessed harness models, the output data generator 1100 stores the generated intermediate file into the intermediate file storage unit 200 (step S23).

By carrying out such a processing, the three-dimensional CAD system 300, using the processing similar to the conventional processing, can construct solid models as parts generated by dividing the harness model into sections.

Typically, plural wires are covered or bundled, or are bound without being covered, or are branched, however, the basic processing contents are as described above, and by dividing the model into sections at the control points, and dividing the sections into surfaces as closed models, the three-dimensional CAD system 300 can restore the model.

Even when outputting an intermediate file in the intermediate format from a three-dimensional CAD system 300 and constructing a harness model by the design verification apparatus 1000, data as described above is processed, in which each part is divided into four surfaces.

Figure 8:
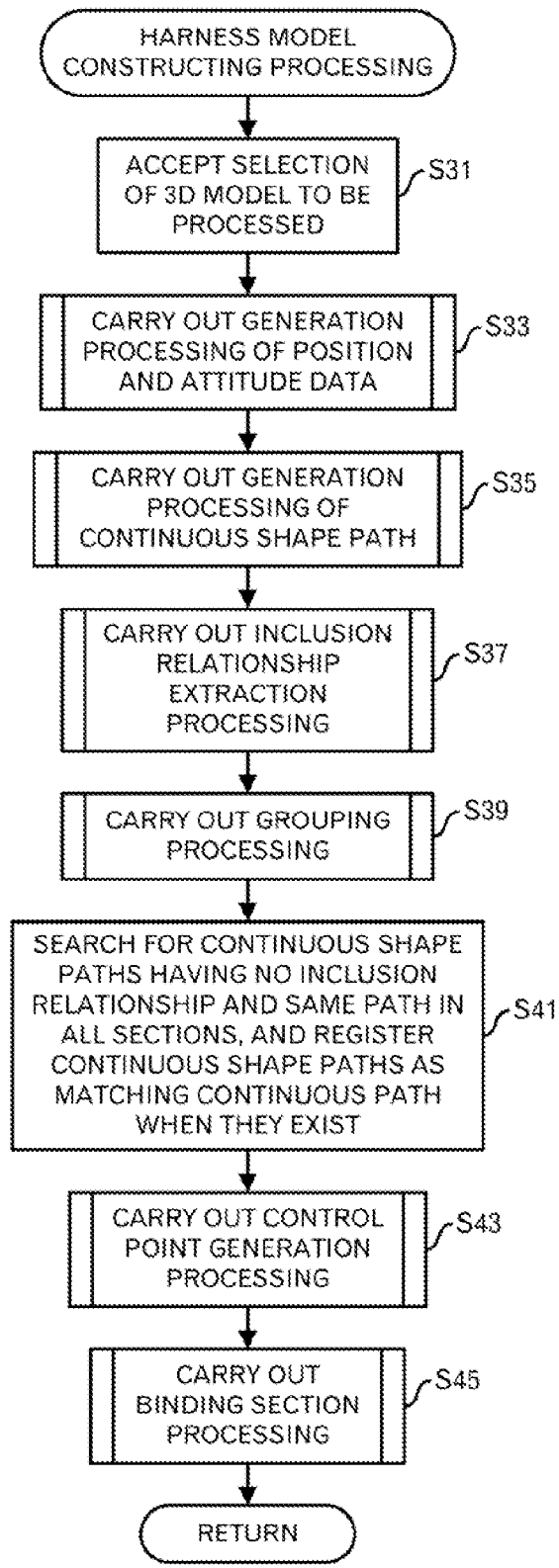
FIG. 8 is a diagram depicting a processing flow of a harness model constructing processing.

Next, the harness model constructing processing (step S7) will be explained using FIG. 8 to FIG. 36. First, the harness model constructing unit 1200 accepts, from the designer, a selection of a three-dimensional model to be processed (FIG. 8: step S31). A selection can be accepted individually, or plural three-dimensional models that conform with designated search conditions may be selected. In the following, a processing is carried out for each part that is included in the three-dimensional model.

Next, the shape analyzer 1210 of the harness model constructing unit 1200 carries out a generation processing of position and attitude data (step S33). This generation processing of the position and attitude data will be explained using FIG. 9 to FIG. 15.

Figure 9:
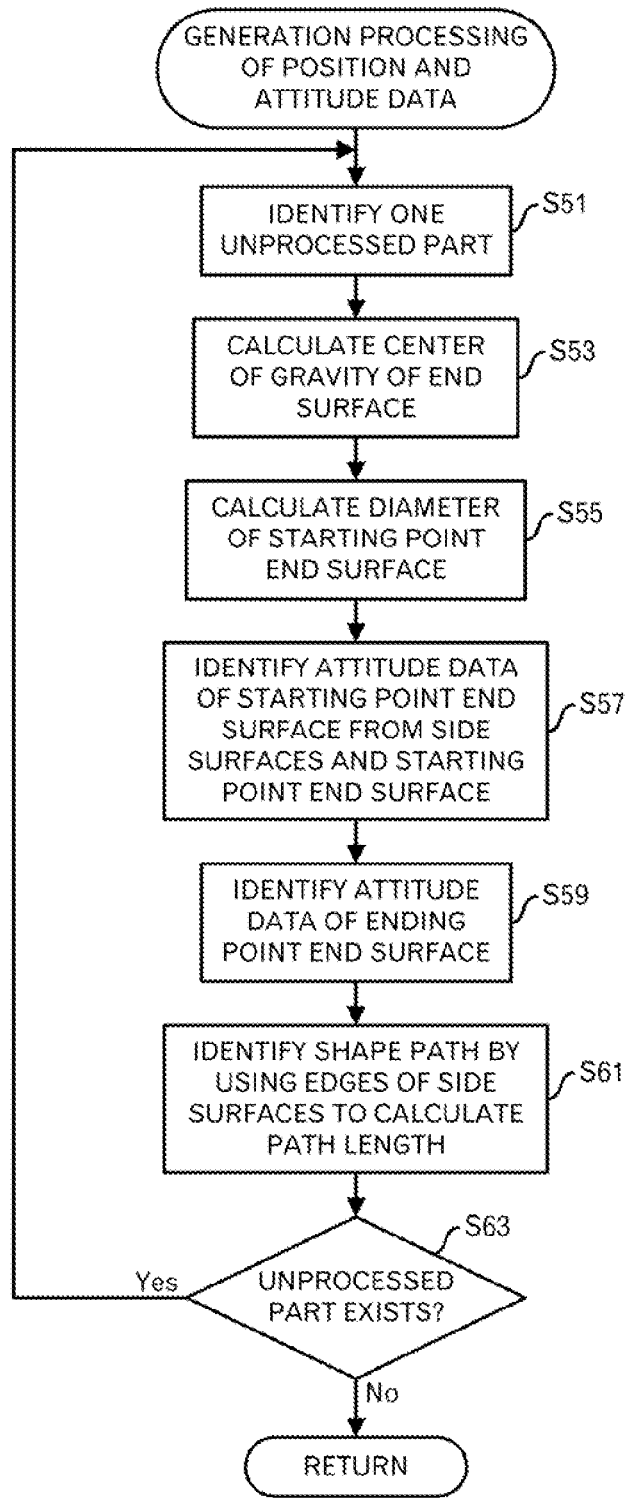
FIG. 9 is a diagram depicting a processing flow of a position and attitude data generation processing.
Figure 10:
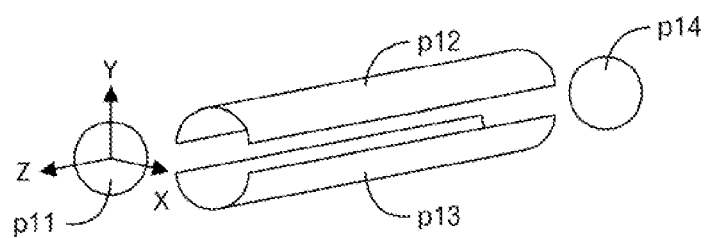
FIG. 10 is a diagram to explain a part processed in the position and attitude data generation processing.

First, the shape analyzer 1210 identifies one unprocessed part that is formed by four surfaces (FIG. 9: step S51). Similar to the shape as illustrated in FIG. 7, however, here, it is assumed that data of a part model 1 is read, as illustrated in FIG. 10, which has a flat starting point end surface p11, a top surface p12, a bottom surface p13 and a flat ending point end surface p14.

Figure 11:
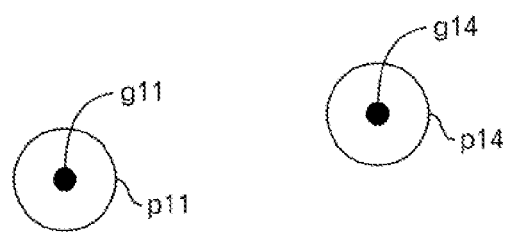
FIG. 11 is a diagram to explain the center of gravity of an end surface.

The shape analyzer 1210 then calculates the centers of gravity for the two end surfaces of the four surfaces, and stores those in the harness model data storage unit 1500 as starting point position data and ending point position data (step S53). As schematically illustrated in FIG. 11, the center of gravity g11 of the starting point end surface p11 and the center of gravity g14 of the ending point end surface p14 are calculated using a known method. In the case of a circle, the center of gravity is the center of the circle.

Figure 12:
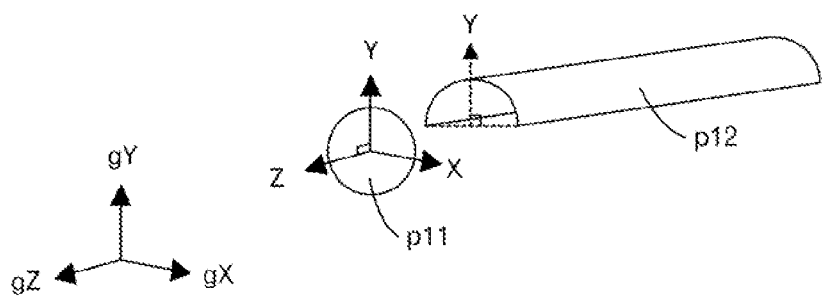
FIG. 12 is a diagram to explain attitude data.

Furthermore, the shape analyzer 1210 calculates the diameter of the starting point end surface p11 and stores that diameter in the harness model data storage unit 1500 (step S55). The shape analyzer 1210 also identifies attitude data of the starting point end surface from the side surfaces and starting point end surface, and stores that data in the harness model data storage unit 1500 (step S57). For example, as illustrated in FIG. 12, a line is obtained by connecting the end points of the edge, which is adjacent to the starting point end surface p11, for the top side surface p12, which is the surface having the smallest surface number among the two side surfaces, and the direction that crosses the contour line of the ending point end surface p11 orthogonally to that line is set as the Y direction, the direction normal to the ending point end surface p11 is set as the Z direction, and the X direction from these two axes is identified and set according to a right-handed system, for example. As illustrated on the left side of FIG. 12, the directions of reference axes are set as gX, gY and gZ, and relative values are calculated with respect to these directions as attitude data, and are stored. In other words, when the X, Y and Z directions are the same directions as these directions, the attitude data becomes (0, 0, 0).

Figure 13A:
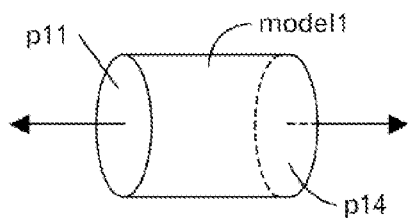
FIG. 13A is a diagram to explain the attitude data.
Figure 13B:
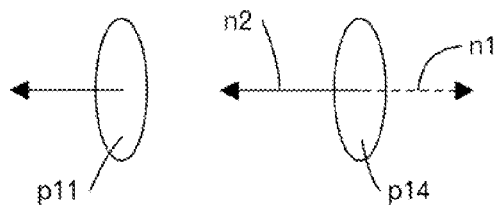
FIG. 13B is a diagram to explain the attitude data.

Furthermore, the shape analyzer 1210 identifies attitude data for the ending point end surface p14, and stores that data in the harness model data storage unit 1500 (step S59). As illustrated in FIG. 13A and FIG. 13B, the normal lines of the end surfaces p11 and p14 face toward the outside of the part, however, in this embodiment, the normal line n2, which is in the opposite direction of the normal line n1 of the ending point end surface p14 is identified as attitude data, as illustrated in FIG. 13B. Similar to the starting point end surface p11, relative values with respect to the reference directions are stored in the harness model data storage unit 1500.

Figure 14A:
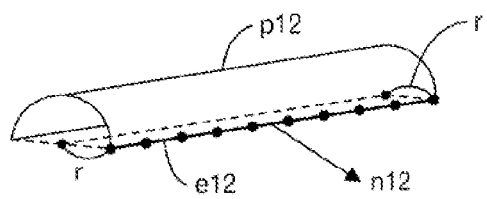
FIG. 14A is a diagram to explain a calculation method of a shape path length.
Figure 14B:
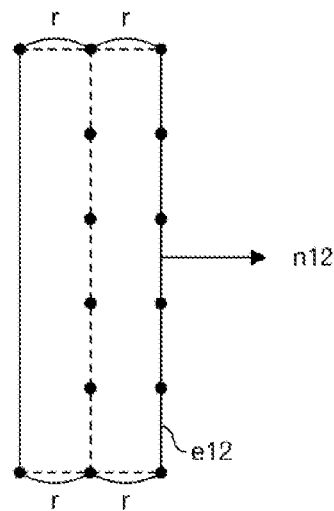
FIG. 14B is a diagram to explain the calculation method of the shape path length.

The shape analyzer 1210 also identifies a shape path using the edges of the side surfaces, then calculates the shape path length, which is the length of that shape path, and stores that length in the harness model data storage unit 1500 (step S61). As is schematically illustrated in FIG. 14A (perspective view) and FIG. 14B (top view), points along the edge e12 of the top surface p12 (for example, points obtained by dividing the edge e12 in unit lengths, or the apex points of polygons on the edge e12) are offset by half r of the diameter ($2r$) in the direction opposite to the normal line n12 (in other words, in the direction toward the center of the column), and the lengths of the lines connecting the points after the offset are calculated and summed to calculate the shape path length.

The shape analyzer 1210 then determines whether or not any unprocessed parts are included in the intermediate file (step S63), and when there is an unprocessed part, the processing returns to the step S51. On the other hand, when there are no unprocessed parts, the processing returns to the calling-source processing.

After carrying out the processing up to this point, model position and attitude data such as illustrated in FIG. 15 is stored in the harness model data storage unit 1500. FIG. 15 illustrates an example that includes 18 parts, the starting point position (X, Y, Z), the starting point attitude data (RX, RY, RZ), and the ending point position (X, Y, Z), the ending point attitude data (RX, RY, RZ), the diameter, and the shape path length are registered for each part. The position data is expressed in absolute coordinate values. Moreover, a set of the starting point position and starting point attitude data and a set of the ending point position and ending point attitude data are control point candidate data. This data is used to calculate the control points, or in some cases may be used as is as the control points. The diameter is data defining the end surface. The shape path length is data that expresses a path candidate between control point candidates. This data is used to calculate the section lengths between the control points, or in some cases the shape path length may be used as is as the section length.

Returning to the explanation of the processing in FIG. 8, next, the integration processing unit 1220 carries out a generation processing of a continuous shape path (step S35). This processing is a processing to collect and integrate parts that are considered as being parts for the same wire although the wire is divided into plural parts. The generation processing of the continuous shape path will be explained using FIG. 16 to FIG. 18.

Figure 16:
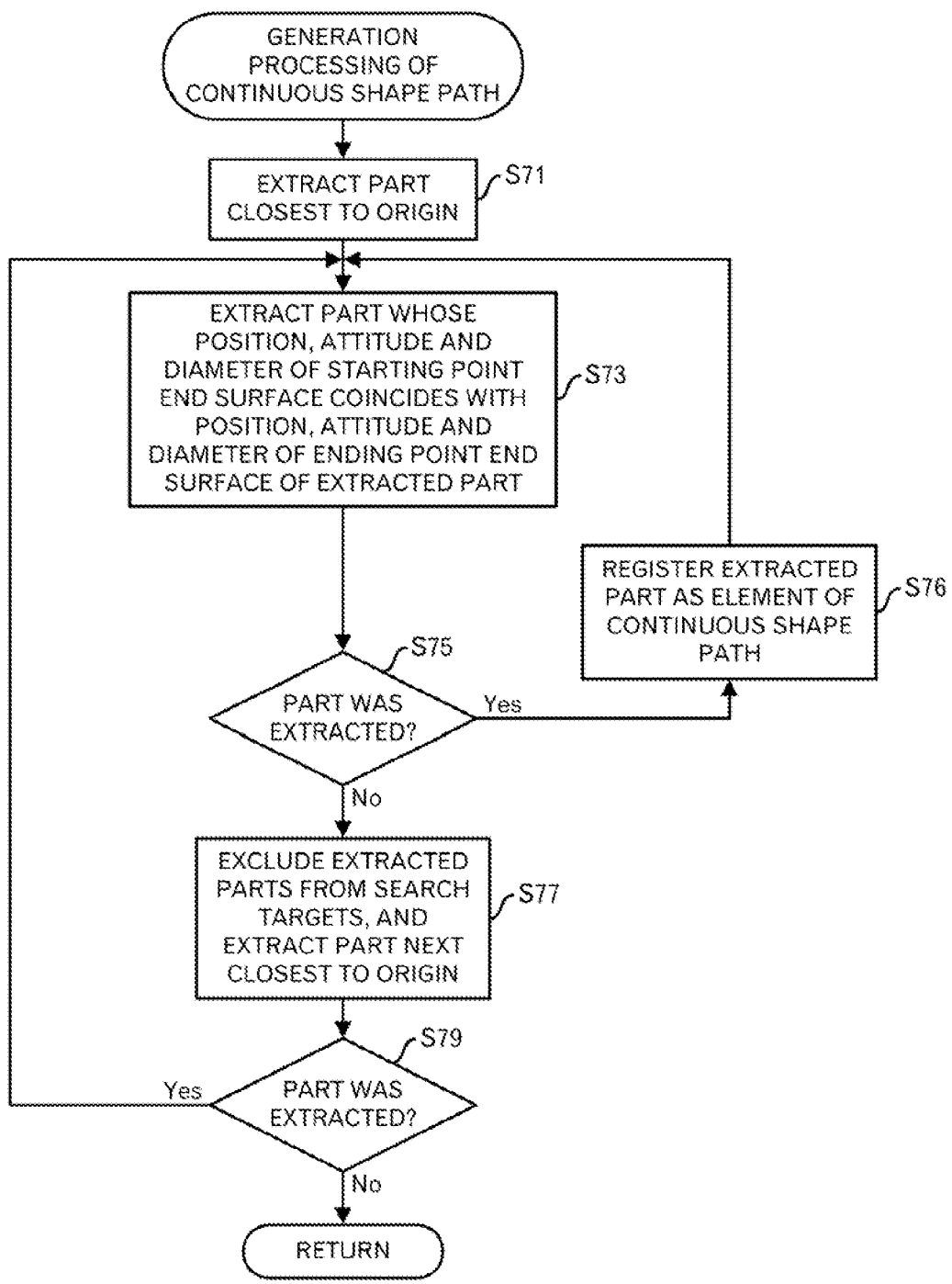
FIG. 16 is a diagram depicting a processing flow of a continuous shape path generation processing.

The integration processing unit 1220 extracts the part that is closest to the origin of the absolute coordinate system, from the model position and attitude data (FIG. 16: step S71). Then, the integration processing unit 1220 searches for and extracts a part whose position, attitude and diameter of the starting point end surface coincide with those of the ending point end surface of the extracted part (step S73). As is schematically illustrated in FIG. 17, the integration processing unit 1220 finds a part m200 whose position, attitude and diameter of the starting point end surface p201 coincide with the position, attitude and diameter of the ending point end surface p104 of a part m100.

In the case where it was possible to extract a part at the step S73 (step S75: YES route), the integration processing unit 1220 stores data of the extracted part in the harness model data storage unit 1500 as an element of the continuous shape path (step S76). The processing then returns to the step S73.

On the other hand, in case where it is not possible to extract a part at the step S73 (step S75: NO route), when an extracted part was registered at the step 76 as an element of the continuous shape path, the integration processing unit 1220 stops registering parts for that continuous shape path, and removes the parts extracted at the steps S71 and S73 from search targets. After that, the integration processing unit 1220 extracts the part that is the next closest to the origin (step S77). When a part was extracted at the step S77 (step S79: YES route), the processing returns to the step S73. However, when a part was not extracted at the step S77, or in other words, when the processing has been carried out for all of the parts (step S79: NO route), the processing returns to the calling-source processing.

By carrying out such a processing, parts are collected for each wire, and data such as illustrated in FIG. 18 is stored in the harness model data storage unit 1500 as continuous shape path data. In the example in FIG. 18, an identifier for the continuous shape path, the diameter and identifiers for parts that are elements of that continuous shape path are registered. In this example, ten wires are specified. Incidentally, one part may be registered for one continuous shape path. As for the diameter data, data that is read from the model position and attitude data when the data for the continuous shape path is first registered in the table illustrated in FIG. 18 is registered, for example.

Returning to the explanation of the processing in FIG. 8, next, the assembly constructing unit 1230 carries out an inclusion relationship extraction processing (step S37). The inclusion relationship extraction processing will be explained using FIG. 19 to FIG. 21.

As schematically illustrated in FIG. 19, the inclusion relationship extraction processing is a processing to search for other continuous shape paths, that are continuous shape paths having an ending point end surface on the same plane (it is determined from the attitude data and position data.) as the ending point end surface p303 of a continuous shape path s303, and that have an ending point end surface that is enclosed inside the ending point end surface p303 of the continuous shape path s303. In the example in FIG. 19, the continuous shape paths s301 and s302 are found, although they are separated so that they can be easily seen.

Figure 20:
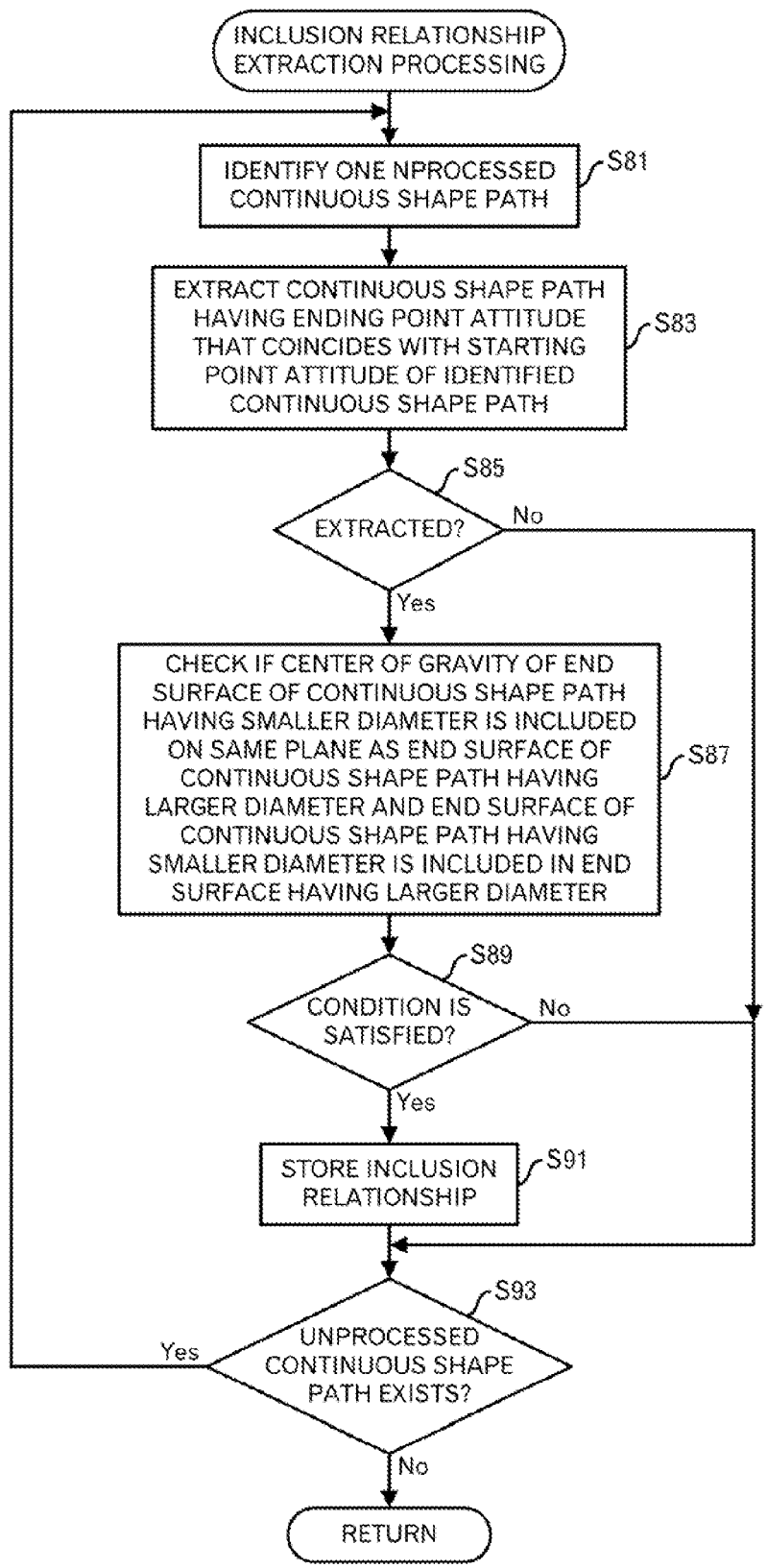
FIG. 20 is a diagram depicting a processing flow of the inclusion relationship extraction processing.

More specifically, the assembly constructing unit 1230 identifies one unprocessed continuous shape path from the continuous shape path data (FIG. 20: step S81). Then, the assembly constructing unit 1230 searches the continuous shape path data and model position and attitude data for a continuous shape path that has ending point attitude data that coincides with the starting point attitude data of the identified continuous shape path, to extract the continuous shape path (step S83). More specifically, the assembly constructing unit 1230 identifies, one at a time, a part on an ending point side of other continuous shape paths from the continuous shape path data, identifies attitude data at the ending point of the part on the ending point side from the model position and attitude data, and compares that identified attitude data with the attitude data at the starting point of the identified continuous shape path. There are cases that there are no parts having the same attitude, and cases that plural parts are extracted.

When other continuous shape paths having the same attitude data are not extracted (step S85: NO route), the processing advances to step S93. On the other hand, when another continuous shape path having the same attitude data is extracted (step S85: YES route), the assembly constructing unit 1230 checks whether or not the center of gravity (starting point or ending point included in the model position and attitude data) of the end surface of the continuous shape path having a smaller diameter is included on the same plane as the end surface (starting point end surface or ending point end surface) of the continuous shape path having a larger diameter, and the end surface of the continuous shape path having a smaller diameter is included inside the end surface having the larger diameter (step S87). As illustrated in FIG. 19, the assembly constructing unit 1230 checks whether or not the ending point end surfaces p301 and p302 of the continuous shape paths s301 and s302 are included in the starting point end surface p303 of the continuous shape path s303, and checks whether or not the ending point end surface grasped from the ending position and diameter of the continuous shape path s301 and the ending point end surface grasped from the ending point position and diameter of the continuous shape path s302 are within the range identified by the starting point position and diameter of the continuous shape path s303.

When there are no other continuous shape paths that satisfy the aforementioned conditions (step S89: NO route), the processing moves to step S93. However, when another continuous shape path that satisfies these conditions can be extracted (step S89: YES route), the assembly constructing unit 1230 stores the inclusion relationship of the identified continuous shape path and the extracted continuous shape path in the harness model data storage unit 1500 (step S91).

For example, the inclusion relationship data as illustrated in FIG. 21 is registered in the harness model data storage unit 1500. In an example of FIG. 21, an identifier of the continuous shape path on ending point side, an identifier of the continuous shape path on the starting point side, and data representing which includes the other are registered.

For example, when the continuous shape path s303 is Section4, the continuous shape path s301 is Section2 and the continuous shape path s302 is Section3, the records of the top two lines in FIG. 21 are registered. In other words, the continuous shape path on the ending point side is registered as Section2, and the continuous shape path on the starting point side is registered as Section4, and because the including surface is the starting point side of the continuous shape path Section4, the data "Section4-start" that represents the including side is also registered. Moreover, the continuous shape path on the ending point side is registered as Section3, and the continuous shape path on the starting point side is registered as Section4, and because the including surface is the starting point side of the continuous shape path Section4, the data "Section4-start" that represents the including side is also registered.

The assembly constructing unit 1230 then determines whether or not there are any unprocessed continuous shape paths in the continuous shape path data (step S93). When there is an unprocessed continuous shape path, the processing returns to the step S81. On the other hand, where there are no unprocessed continuous shape paths, the processing returns to the calling-source processing.

In this way, it is possible to extract a state that wires bundled by a cover come out from the covered portion.

Returning to the explanation of FIG. 8, the assembly constructing unit 1230 carries out a grouping processing (step S39). The grouping processing will be explained using FIG. 22 and FIG. 23.

Figure 22:
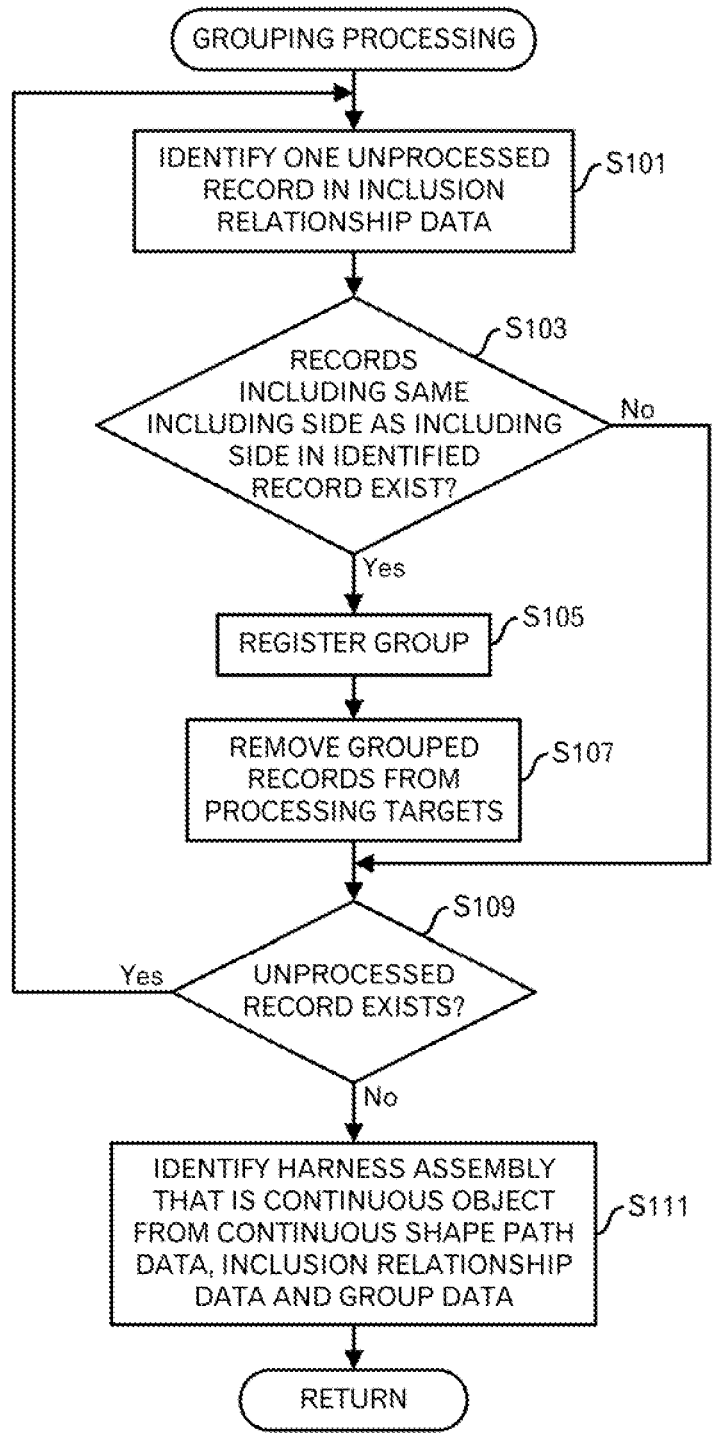
FIG. 22 is a diagram depicting a processing flow of a grouping processing.

First, the assembly constructing unit 1230 identifies one unprocessed record from the inclusion relationship data (FIG. 22: step S101). The assembly constructing unit 1230 then determines whether or not there are any records that include an including side that is the same as the including side in the identified record (step S103). When there are no records, the processing moves to step S109.

On the other hand, when there are records that include an including side that is the same as the including side in the identified record, the assembly constructing unit 1230 stores the inclusion relationship that is expressed by those records in the harness model data storage unit 1500 as a group (step S105). For example, group data as illustrated in FIG. 23 is stored. In the example of FIG. 23, a group identifier, an identifier of the including side, and identifiers of the inclusion relationship relating to that including side are registered. In the example in FIG. 21, the top two lines and the bottom two lines are grouped.

The assembly constructing unit 1230 then removes the grouped records from the processing targets (step S107). After that, the assembly constructing unit 1230 determines whether or not there are any unprocessed records in the inclusion relationship data (step S109). Where there is an unprocessed record, the processing returns to the step S101. However, when there are no unprocessed records, the assembly constructing unit 1230 identifies a harness assembly, which is a continuous object, based on the model position and attitude data, from the continuous shape path data, inclusion relationship data and group data that are stored in the harness model data storage unit 1500, generates harness assembly data, and stores that data in the harness model data storage unit 1500 (step S111). The processing then returns to the calling-source processing.

For example, in the continuous shape path data illustrated in FIG. 18, the continuous shape path Section1 is not included in the inclusion relationship data illustrated in FIG. 21. Therefore, the continuous shape path Section1 is determined to be one harness assembly, and is registered. The similar processing is carried out for continuous shape paths Section7 and Section8.

On the other hand, continuous shape paths Section2 and Section3 are included in the ending point side of the inclusion relationship data illustrated in FIG. 21, and the identifiers of the inclusion relationships in that inclusion relationship data are grouped by the group data illustrated in FIG. 23. Therefore, such a group is given priority to identify the relationship. Similarly, continuous shape paths Section5 and Section6 are also included in the starting point side of the inclusion relationship data, and the identifiers of the inclusion relationships in that inclusion relationship data are grouped by the group data. Therefore, such a group is given priority to identify the relationship.

When a group whose continuous shape path included in the identifier of the including side is the same is identified in the group data, groups Group1 and Group2 are identified, and it is identified that these are groups that are connected with both end surfaces of Section4 that is the including side. Therefore, a harness in which Group1, Section4 and Group2 are connected in this order, is registered.

As a result, harness assembly data as illustrated in FIG. 24, for example, is stored in the harness model data storage unit 1500. In the example in FIG. 24, an identifier of the harness assembly, and the continuous shape paths or continuous shape path groups that are included in that harness assembly are registered.

By carrying out the processing as described above, it becomes possible to identify an integrated harness assembly. However, there are also cases in which plural wires are bound together without using covering.

Returning to the explanation of the processing in FIG. 8, the assembly constructing unit 1230 searches for continuous shape paths having no inclusion relationship and having the same path in all of the sections, and when there are such continuous shape paths, the assembly constructing unit 1230 stores those paths in the harness model data storage unit 1500 as matching continuous paths (step S41).

For example, in the harness assembly data as illustrated in FIG. 24, records, for which group identifiers are registered, are excluded because there is an inclusion relationship, and for the other harness assemblies, the assembly constructing unit 1230 extracts, from the starting point position and starting point attitude data that are included in the model position and attitude data, plural harness assemblies whose starting point sides are on the same plane, and when there are plural extracted harness assemblies, harness assemblies whose ending point sides are also on the same plane only have to be extracted from those extracted harness assemblies.

Figures 25, 26, 27:
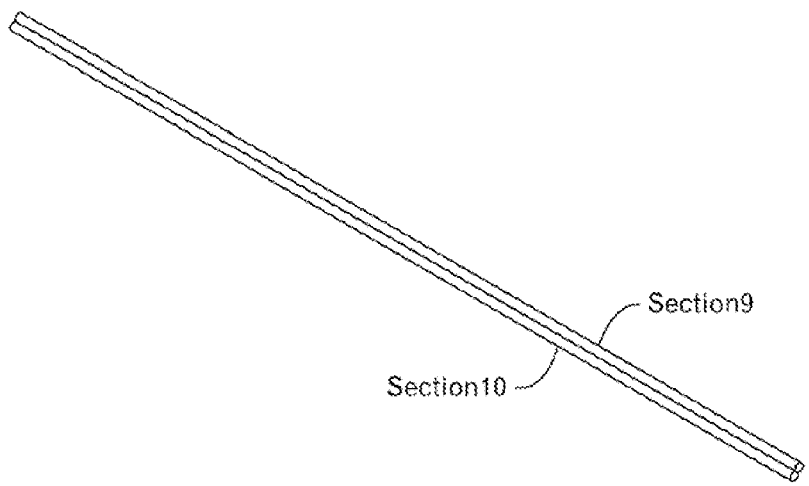
FIG. 25 is a diagram to explain a matching continuous path.
FIG. 26 is a diagram depicting an example of layout data.
FIG. 27 is a diagram depicting an example of updated harness assembly data.

In the case illustrated in FIG. 24, harness assemblies Harness5 and Harness6 correspond to the continuous shape paths Section9 and Section10. The part Model17 and part Model18 on the starting point side are then identified from the continuous shape path data in FIG. 18. Furthermore, the starting point position (30, 0, 0) and the starting point attitude (0, 0, 0) of the part Model17 and the starting point position (30, 1, 0) and starting point attitude (0, 0, 0) of the part Model18 are identified from the model position and attitude data in FIG. 15, and they are determined to satisfy the first condition. Moreover, the part Model17 and part Model18 on the ending point side are identified from the continuous shape path data in FIG. 18. Furthermore, the ending point position (30, 0, 100) and the ending point attitude (0, 0, 0) of the part Model17 and the ending point position (30, 1, 100) and ending point attitude (0, 0, 0) of the part Model18 are identified from the model position and attitude data in FIG. 15, and determined to satisfy the second condition. In other words, as is schematically illustrated in FIG. 25, it can be seen that the continuous shape paths Section9 and Section10 are the same path over all sections. Such harness assemblies that have the same path over all sections are presumed to be a wire group that is connected to the same connector.

Therefore, layout data as illustrated in FIG. 26 is stored. In the example in FIG. 26, an identifier of a matching continuous path and identifiers of the extracted continuous shape paths are registered. Furthermore, the relationship that is extracted in this way is registered in the harness assembly data as well. In other words, the harness assembly illustrated in FIG. 24 is also updated as illustrated in FIG. 27. That is, two harness assemblies are joined into one from a state that they are identified as separate harness assemblies.

After that, the control point data generator 1240 carries out a control point generation processing (step S43). The control point generation processing will be explained using FIG. 28 to FIG. 33.

Figure 28:
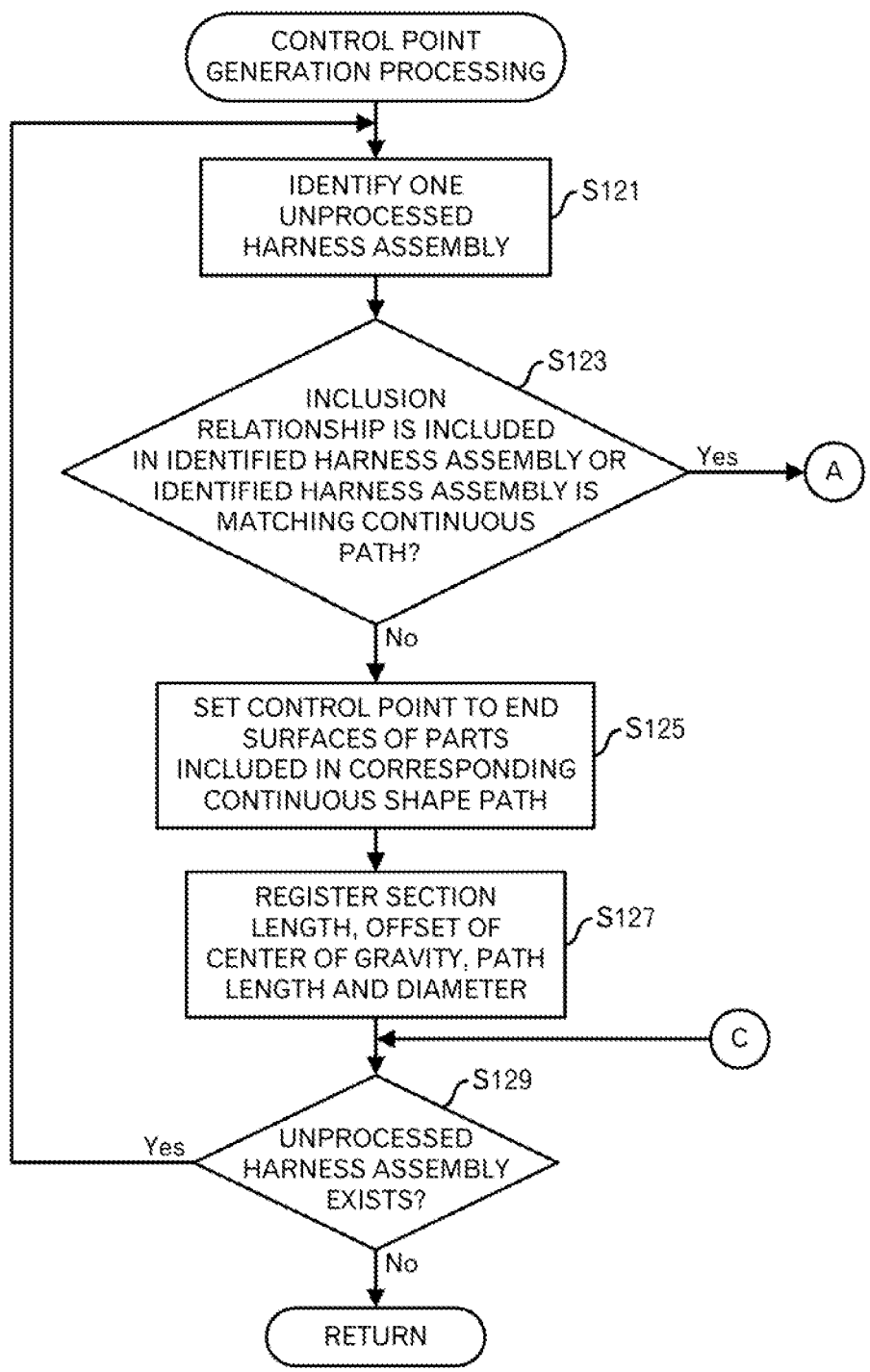
FIG. 28 is a diagram depicting a processing flow of a control point generation processing.

First, the control point data generator 1240 identifies one unprocessed harness assembly in the harness assembly data (FIG. 28: step S121). Then the control point data generator 1240 determines whether or not an inclusion relationship is included in the identified harness assembly or whether or not the identified harness assembly is a matching continuous path (step S123). For example, in the example in FIG. 27, in the case of harness assembly Harness2, a group identifier is included, so the condition is satisfied in this case. When an inclusion relationship is included in the harness assembly, or when the harness assembly is a matching continuous path, the processing moves to the processing in FIG. 30 via terminal A.

For example, when processing the harness assembly Harness1, the harness assembly is as illustrated in FIG. 4. Therefore, it is determined that the conditions are not satisfied. Incidentally, in FIG. 4, s1 is the continuous shape path Section1, m1 is the part Model1, m2 is the part Model2 and m3 is the part Model3.

When there is no inclusion relationship included in the identified harness assembly, and when the harness assembly is not a matching continuous path, the control point data generator 1240 sets control points at the end surfaces of the parts of the continuous shape paths that are included in the identified harness assembly (step S125). In the example in FIG. 4, the control point data generator extracts the position data and attitude data of the starting points and ending points for the parts Model1 to Model3 from the model position and attitude data, and stores that data in the harness model data storage unit 1500.

Furthermore, the control point data generator 1240 calculates the section lengths between control points, the offset of the center of gravity on the end surface of each part from the control point, the path length from the starting point to the ending point of each part and the diameter of each part, and stores the results in the harness model data storage unit 1500 (step S127).

When plural parts or continuous shape paths are bundled, the section length between control points is the average value of these path lengths. In the example in FIG. 4, there is only one, so the section length is the same as the path length of the part. Furthermore, when the center of gravity and the control point on an end surface differ, the offset of the center of gravity on the end surfaces of each part from the control point is calculated, however, in the example in FIG. 4, they coincide, so the offset becomes (0, 0, 0). The path length and the diameter of a part are the same as the original values. As a result, data as illustrated in FIG. 5 is generated and stored in the harness model data storage unit 1500.

The control point data generator 1240 then determines whether or not there are any unprocessed harness assemblies in the harness assembly data (step S129). When there is an unprocessed harness assembly, the processing returns to the step S121. On the other hand, when there are no unprocessed harness assemblies, the processing returns to the calling-source processing.

Figure 29:
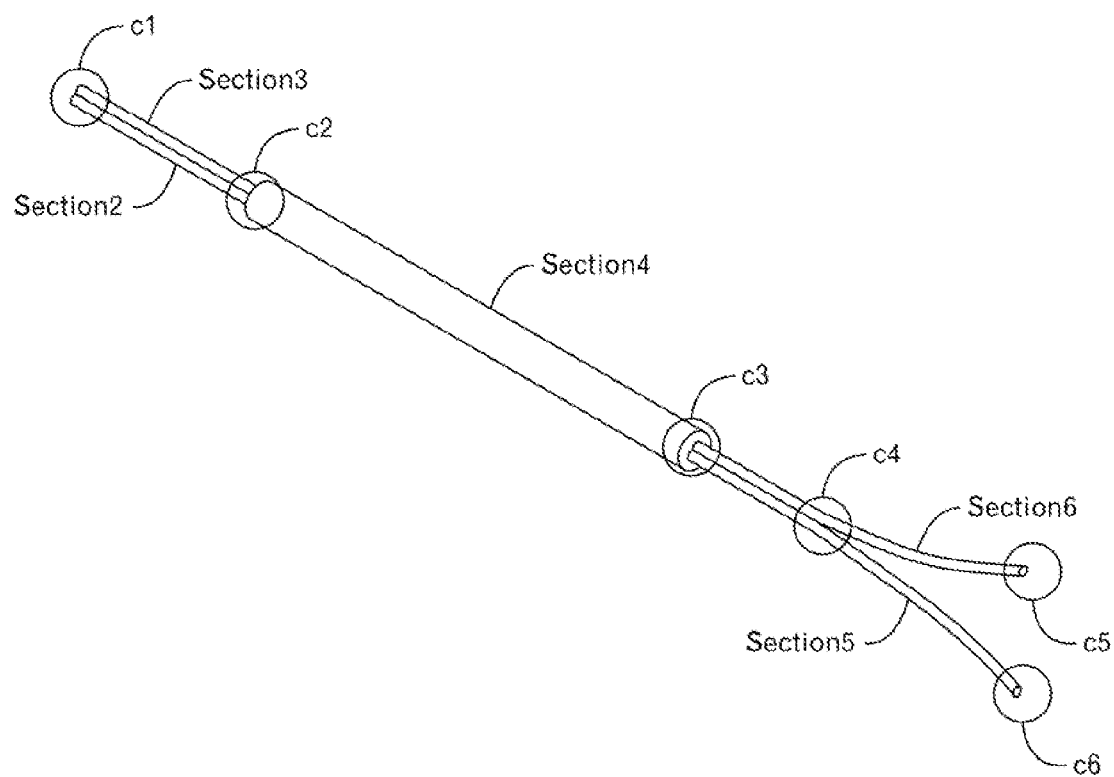
FIG. 29 is a diagram depicting an example of a harness assembly to be processed.

Next, the processing after the terminal A will be explained using FIG. 29 to FIG. 32. For example, a case that a processing for a harness assembly Harness2 as illustrated in FIG. 29 is carried out will be considered. The harness assembly Harness2 includes the continuous shape paths Section2, Section3, Section4, Section5 and Section6 from FIG. 27, FIG. 23, FIG. 21, FIG. 15 and FIG. 18. Each continuous shape path may also include plural parts.

Figure 30:
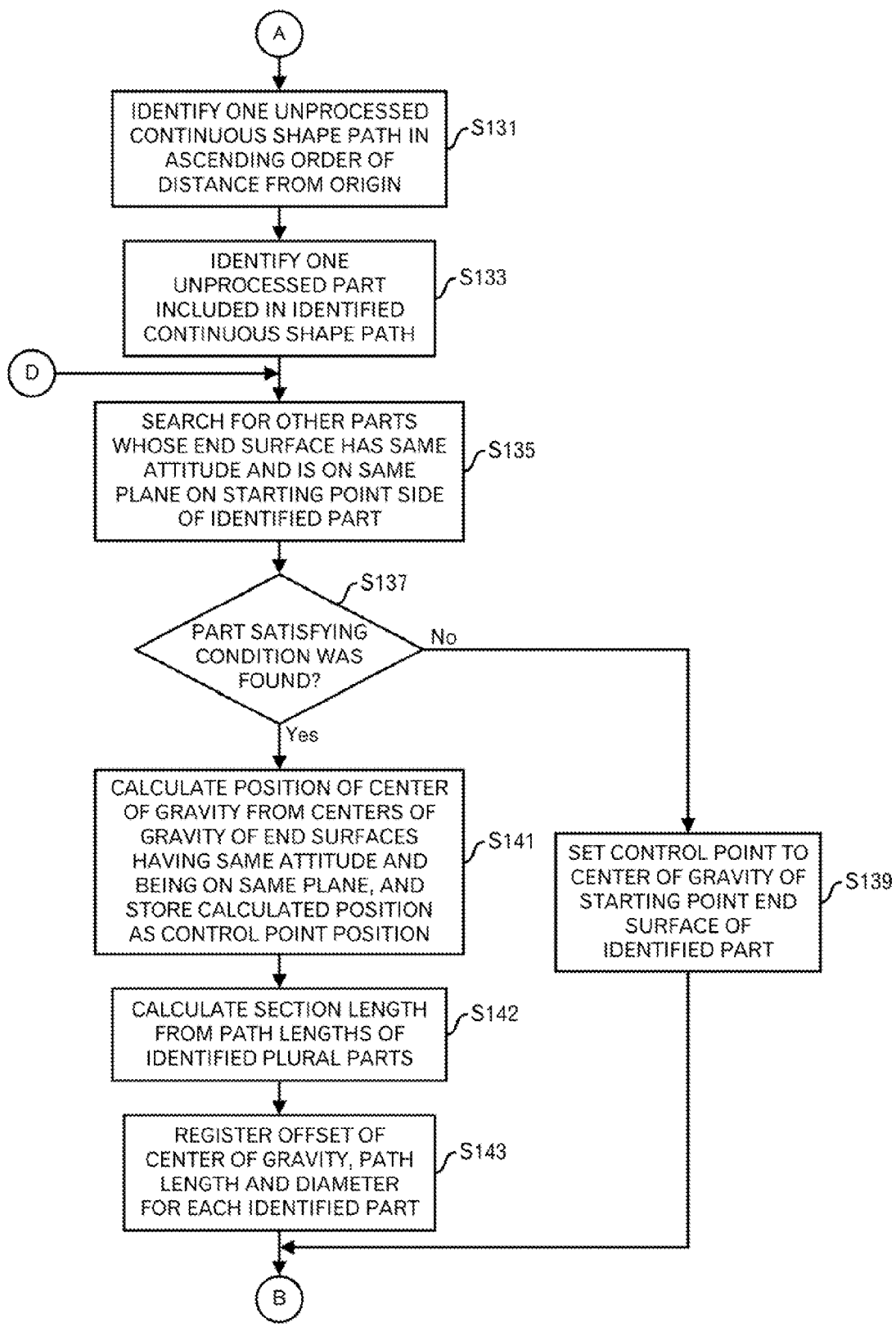
FIG. 30 is a diagram depicting a processing flow of the control point generation processing.

First, the control point data generator 1240 identifies one unprocessed continuous shape path in the harness assembly to be processed in an ascending order of the distance from the origin (FIG. 30: step S131). The control point data generator 1240 then identifies one unprocessed part that is included in the identified continuous shape path (step S133). Next, the control point data generator 1240 searches for other parts whose end surface has the same attitude and is on the same plane on the starting point side of the identified part (step S135). In the case illustrated in FIG. 29, based on the position data and attitude data of the starting point end surface of part Model4 of the continuous shape path Section2, other parts whose end surface has the same attitude and is on the same plane are searched for. Then, the starting point end surface of part Model5 of the continuous shape path Section3 is found in the model position and attitude data in FIG. 15.

When no corresponding parts are found in the search of the step S135 (step S137: NO route), the control point data generator 1240 sets the control point to the center of gravity of the starting point end surface of the identified part, and stores that control point data in the harness model data storage unit 1500 (step S139).

In this case, the center of gravity of the starting point end surface of the identified part is set as the control point as it is. Therefore, the position data and the attitude data of the control point are the same data. The section length also is the same as the path length of the part. Furthermore, also as for the continuous shape path data relating to that control point, the offset of the center of gravity from the control point for that position and attitude is "0", and the shape path length and diameter are the values of that part as they are. The processing then moves to the processing in FIG. 33 via terminal B.

Figure 31:
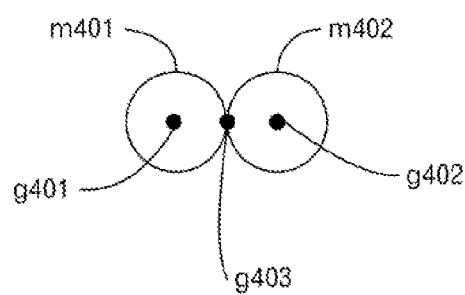
FIG. 31 is a diagram to explain the calculation of the center of gravity.

On the other hand, when corresponding parts are found in the search at the step S135 (step S137: YES route), the control point data generator 1240 calculates those centers of gravity from the centers of gravity of the end surfaces of plural parts that were determined to have the same attitude and to be on the same plane, and stores those centers of gravity together with the attitude data of the end surface to be processed in the harness model data storage unit 1500 (step S141). As illustrated in FIG. 31, the control point data generator 1240 calculates the center of gravity g403 of the end surface from the center of gravity g401 of the end surface of the part m401 and the center of gravity g402 of the end surface of the part m402. The attitude data is the same. Therefore, it is stored, as it is, in the harness model data storage unit 1500. In the example in FIG. 29, the center of gravity is calculated from the position data of the starting point end surface of part Model4 of the continuous shape path Section2 and the position data of the starting point end surface of part Model5 of the continuous shape path Section3.

The control point data generator 1240 also calculates the section length from the path lengths of the plural parts, and stores the result in the harness model data storage unit 1500 (step S142). For example, the section length is calculated as the average value of the path lengths. In the case of the parts Model4 and Model5, the path lengths are the same, so the section length is also the same value.

Furthermore, the control point data generator 1240 stores the offset of the center of gravity from the control point, the path length and the diameter for each of the aforementioned plural parts in the harness model data storage unit 1500 (step S143). As a result, it becomes possible to extract data of the continuous shape paths (or parts) related to the control points. The processing then moves to the processing in FIG. 33 via the terminal B.

For example, the harness model data such as illustrated in FIG. 32 is generated. In the example in FIG. 32, the control point position data, control point attitude data and section length are registered for each control point. Furthermore, the offset value of the center of gravity from the control point, the shape path length, and the diameter for each control point are registered as data for the related parts or continuous shape paths. In the example explained above, data for the first control point c1 is registered.

Figure 33:
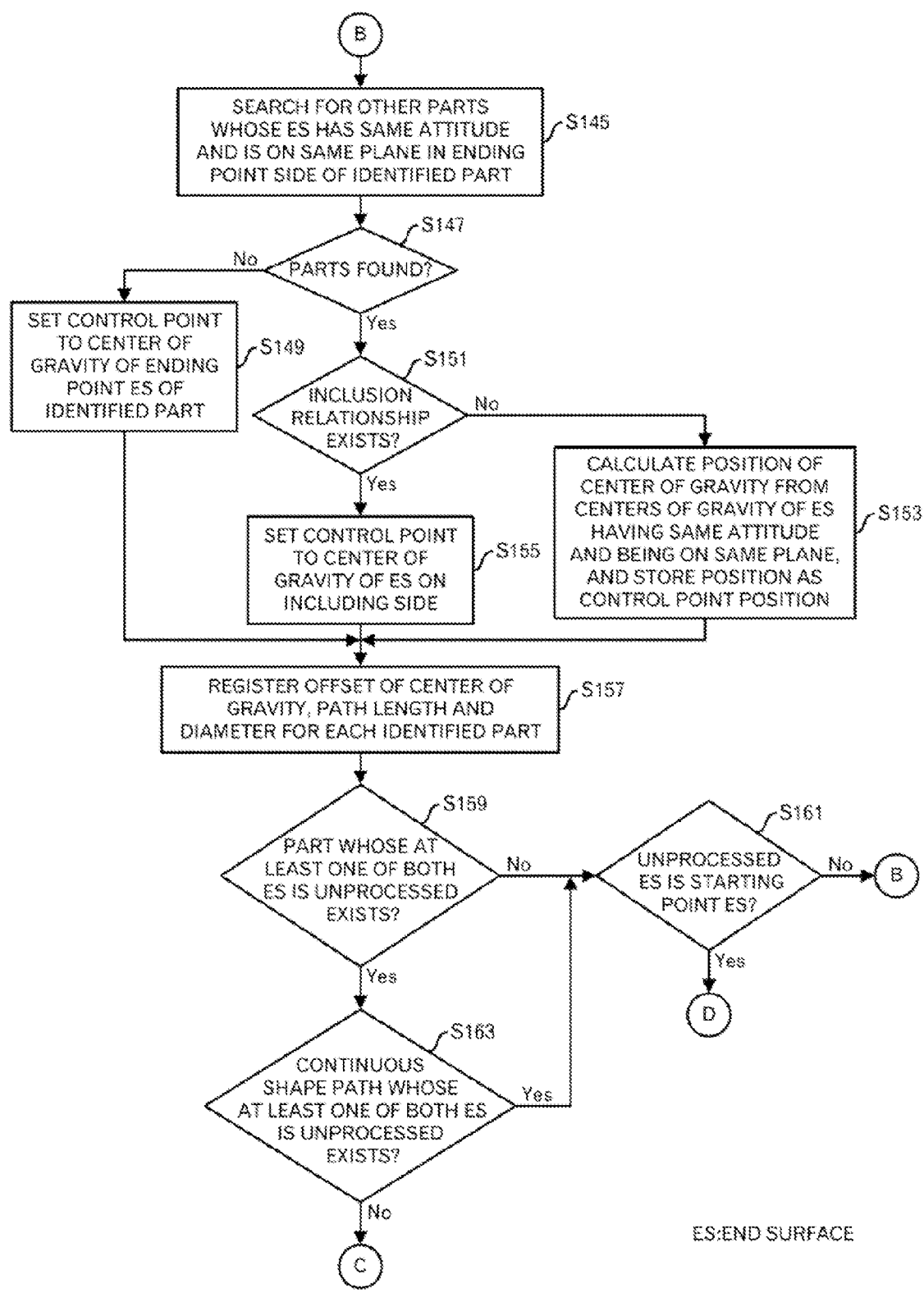
FIG. 33 is a diagram depicting the processing flow of the control point generation processing.

Shifting to an explanation of the processing in FIG. 33, the control point data generator 1240 searches for other parts whose end surface has the same attitude and is on the same plane on the ending point side of the identified part (step S145). When there are no other parts that satisfy this condition (step S147: NO route), the control point data generator 1240 sets the control point to the center of gravity of the ending point end surface of the identified part, and registers data concerning that center of gravity and attitude data (step S149). The processing then moves to step S157.

In the example in FIG. 29, the case of part Model9 of the continuous shape path Section5 and the part Model10 of the continuous shape path Section6 are processed at the step S149. These are control points of terminal ends. Therefore, the attitude data and position data of the center of gravity of the ending point end surfaces of parts Model9 and Model10 are registered as the position data and attitude data of the control points 5*c* and 6*c*, respectively. The section length is not registered in the case of the ending point side. In addition, the offset value of the center of gravity in relation to that control point is registered as (0, 0, 0), and that end is a terminal end. Therefore, 0 is also registered as the shape path length. As for the diameter, the corresponding value is registered.

On the other hand, when there are other parts that satisfy the condition at the step S145, the control point data generator 1240 determines whether or not there is an inclusion relationship with that end surface (step S151). More specifically, the control point data generator 1240 determines whether or not the center of gravity of the ending point end surface of the identified part is included in the starting point end surface of another continuous shape path, or determines whether or not the ending point end surface of the identified part includes the starting point end surface of another part or continuous shape path. The determination is carried out using the position of the center of gravity and the diameter.

When there is no inclusion relationship, it is a case in which there are coupled parts with the same diameter, a case as illustrated in FIG. 25 in which edge portions are found in case that plural wires are arranged in parallel, or a case in which coupled parts with the same diameter are found for the plural wires. In such a case, the control point data generator 1240 calculates the center of gravity of these from the centers of gravity of the end surfaces of plural parts that were determined to have the same attitude and to be on the same plane, and stores that center of gravity together with the attitude data of the end surface to be processed in the harness model data storage unit 1500 (step S153). In the case of the first case among the three cases mentioned above, data concerning the center of gravity data and the attitude data are the same as that of the couple parts. In the remaining two cases, the data is calculated similarly to the calculation at step S141. The processing then advances to step S157.

However, when there is an inclusion relationship, the control point data generator 1240 sets the control point to the center of gravity of the including side, and stores that center of gravity together with the attitude data in the harness model data storage unit 1500 (step S155). In the case illustrated in FIG. 29, the starting point end surface of the continuous shape path Section4 includes the ending point end surfaces of the continuous shape paths Section2 and Section3. Therefore, in this case, the control point data generator 1240 stores the center of gravity data and attitude data for the starting point end surface of continuous shape path Section4 in the harness model data storage unit 1500. The control point data generator 1240 may also calculate a new center of gravity from the center of gravity of the end surface of the included side, and the center of gravity of the end surface on the including side, and set that new center of gravity as the position of the control point. The processing then moves to the step S157.

After that, the control point data generator 1240 stores the offset of the center of gravity from the position of the control point, the path length and diameter data for each of the plural parts to be processed in the harness model data storage unit 1500 (step S157). 0 is set to the path length of an ending point end surface, however the shape path length of the part is set to the path length of a starting point end surface. As a result, it becomes possible to extract data for the continuous shape paths (or parts) relating to the control point.

There are portions for which a section length is not set, however, in the case of only one part, the same value as path length may be set, and in case that plural parts are bundled together, the average value of the shape path lengths may be set.

In the example in FIG. 29, for the second control point c2 of the harness model data illustrated in FIG. 32, data of the relating three continuous shape paths (in other words parts) is registered.

After that, the control point data generator 1240 determines whether or not there are any unprocessed parts on at least one of the end surfaces of the identified continuous shape path being processed (step S159). In the example in FIG. 29, the ending point end surface of part Model6 of the continuous shape path Section4 is unprocessed. When there is a part having an unprocessed end surface, the control point data generator 1240 determines whether or not the unprocessed end surface is a starting point end surface (step S161). In the case of both end surfaces being unprocessed, the starting point end surface has priority. When the unprocessed end surface is a starting point end surface, the processing returns to the step S135 via terminal D.

However, when the unprocessed end surface is not a starting point end surface, the processing returns to the step S145 via terminal B. Furthermore, when there are no parts having an unprocessed end surface in the identified continuous shape path being processed, the control point data generator 1240 determines whether or not there is an unprocessed continuous shape path on at least one of the end surfaces (step S163). When there is an unprocessed continuous shape path, the processing target is switched to that continuous shape path, and the processing moves to step S161. On the other hand, when there is no unprocessed continuous shape path, the processing returns to the processing in FIG. 28 via the terminal C.

In the example in FIG. 29, the processing is next shifted to a processing for the ending point end surface of part Model6 of the continuous shape path Section4. In this case, an inclusion relationship is detected for the starting point end surface of part Model7 of the continuous shape path Section5 and part Model8 of continuous shape path Section6. Therefore, the processing is carried out at the steps S155 and S157, and in the harness model data in FIG. 32, data for the third control point c3 is set. Moreover, in the case of carrying out a processing for the ending point end surfaces of parts Model7 and Model8, the end surface having the same attitude and being on the same plane exists, however, it is determined that there is no inclusion relationship. Therefore, the processing is carried out at the step S153 and S157, and data for the control point c4 is set. Furthermore, the processing is carried out for the ending point end surface of part Model9 and part Model10, however, in this case, no other parts having an end surface being on the same plane and having the same attitude are found for either one. Therefore, the ending point end surfaces are respectively processed at steps S149 and S157 to set the control points.

By carrying out the processing such as described above, the harness model data is generated for each harness assembly regardless of whether the harness assembly is one wire, is a covered wire, or includes plural parallel wires that are connected to a connector, and that harness model data is stored in the harness model data storage unit 1500.

When there is control point position, attitude data and data concerning section length or path length, which are included in the harness model data, it is possible to carry out the processing for a flexible object in the design verification apparatus.

Returning to the explanation of the processing in FIG. 8, the binding section processing unit 1250 carries out a binding section processing (step S45). The binding section processing will be explained using FIG. 34A to FIG. 36.

Figure 34A:
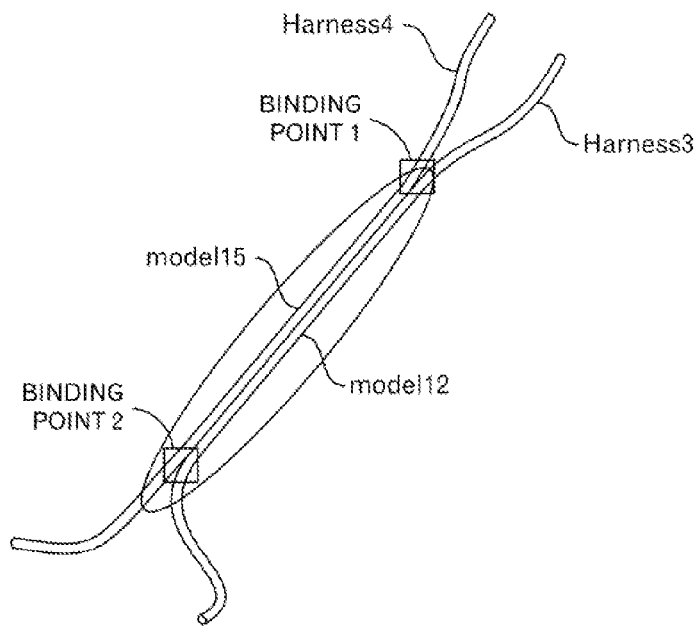
FIG. 34A is a diagram to explain a binding section processing.

As is schematically illustrated in FIG. 34A, even in the case of no inclusion relationship, plural harness assemblies may be bound at binding points. In the example in FIG. 34A, a portion of the harness assembly Harness3 and harness assembly Harness4 is in the same section (in other words, between binding points 1 and 2). More specifically, it can be seen from the data in FIG. 27, FIG. 15 and FIG. 18, parts Model12 and Model15 are in the same section. Data such as described below is generated for such a binding section.

Figure 34B:
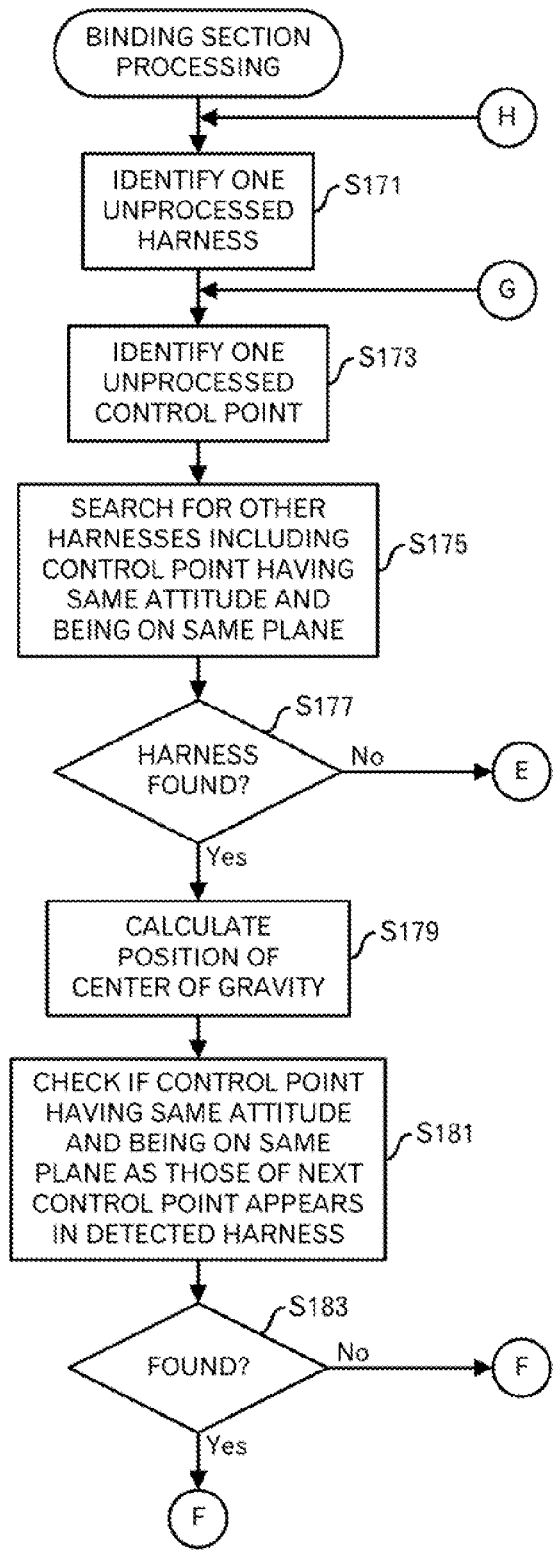
FIG. 34B is a diagram depicting a processing flow of the binding section processing.

In other words, the binding section processing unit 1250 identifies an unprocessed harness assembly in the harness assembly data such as illustrated in FIG. 27 (FIG. 34B: step S171). The binding section processing unit 1250 then identifies one unprocessed control point in the harness model data of the identified harness assembly (step S173). After that, the binding section processing unit 1250 searches for other harness assemblies that have a control point that is on the same plane and has the same attitude as those of the identified control point in the harness model data storage unit 1500 (step S175). When there are no other harness assemblies matching the condition (step S177: NO route), the processing moves to a processing in FIG. 35 via terminal E.

On the other hand, when there is another harness assembly that matches the condition (step S177: YES route), the binding section processing unit 1250 calculates the position of the center of gravity of the control point positions of the control point being processed and the control point that was detected, and stores that center of gravity position in a memory device such as main memory (step S179). A preliminary starting point of this section is identified.

Furthermore, the binding section processing unit 1250 checks whether or not a control point being on the same plane and having the same attitude as those of the next control point of the identified harness assembly appears in the harness assembly detected at the step S175 (step S181). In other words, the binding section processing unit 1250 determines whether or not there is a match for the length of at least one part. Here, when it is determined that the condition is not satisfied (step S183: NO route), the ending point of the section cannot be detected, so the data generated at the step S179 is discarded, and the processing moves to the processing illustrated in FIG. 35 via terminal F. On the other hand, when it is determined that the condition is satisfied (step S183: YES route), the processing moves to the processing in FIG. 35 via terminal F.

Figure 35:
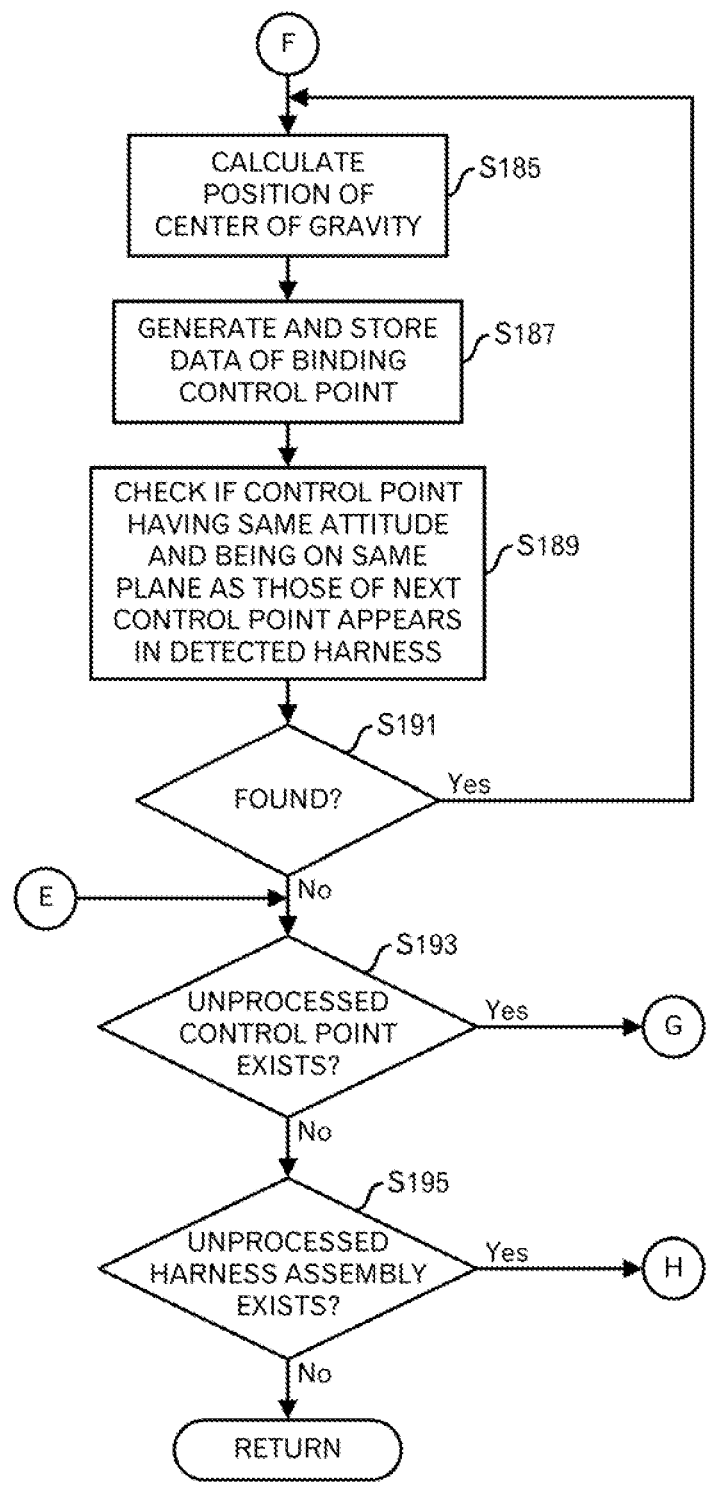
FIG. 35 is a diagram depicting a processing flow of the binding section processing.

Shifting to an explanation of the processing in FIG. 35, after the terminal F, the binding section processing unit 1250 calculates the position of the center of gravity of the control point positions of the control point being processed and the detected control point, and stores that center of gravity in the memory device such as a main memory (step S185). A preliminary ending point is identified.

The binding section processing unit 1250 then generates data for the binding control points whose existence was determined, and stores that data in the harness model data storage unit 1500 (step S187). When the step S187 is first executed, data for two binding control points is registered. For the binding control point of the starting point, the position data for the center of gravity, which was calculated at the step S179, the attitude data that was used at the step S175 and the section length, which is the average value of the path lengths (or section lengths) between control points that satisfy the condition described above, are generated and registered. Furthermore, data including the offset of the control point of the related harness assembly from the binding control point and the identifier of that control point are generated and registered. For the next binding control point, the position data of the center of gravity, which was calculated at the step S185, the attitude data that was used at the step S181 or S189, and the section length, which is the average value of the path lengths (or section lengths) between control points that satisfy the condition above, are generated and registered. However, in the case that a next binding control point is not found, the section length cannot be calculated, so the section length of the previous section is calculated.

For example, binding control point data such as illustrated in FIG. 36 is stored in the harness model data storage unit 1500. In the example in FIG. 36, the binding control point position data, binding control point attitude data and the section length are registered for each binding control point. Furthermore, for each related harness assembly, the offset value of the control point from the binding control point and the identifiers of the corresponding control points in that harness assembly are registered.

In the example in FIG. 34A, the matching section is one part section. Therefore, when the step S187 is first executed, data for two binding control points is registered, and the processing ends.

After that, the binding section processing unit 1250 further checks whether or not a control point that is on the same plane and has the same attitude as those of the further next control point in the identified harness assembly appears in the harness assembly that was detected at the step S175 (step S189). When this condition is satisfied, the matching sections continue. Therefore, the processing returns to the step S185 to carry out the processing. However, when this condition is not satisfied, the matching sections have ended. Therefore, the binding section processing unit 1250 determines whether or not there are any remaining unprocessed control points (step S193). When there is a remaining unprocessed control point, the processing returns to the step S173 in FIG. 34B via terminal G. On the other hand, when there are no more unprocessed control points, the binding section processing unit 1250 determines whether or not there are any unprocessed harness assemblies (step S195). When there is an unprocessed harness assembly, the processing returns to the step S171 in FIG. 34B via terminal H. On the other hand, when there are no unprocessed harness assemblies, the processing returns to the calling-source processing. In other words, the processing is completed.

By carrying out the processing such as described above, it becomes possible to also handle an uncovered bundled state.

With the embodiment described above, even when exchanging data between the three-dimensional CAD system 300 and the design verification apparatus 1000, it is possible to reduce the work of the designer and exchange data smoothly by providing the functions described above in the design verification apparatus 1000.

Especially, when the three-dimensional CAD system 300 outputs the harness data as simply one solid data block, the design verification apparatus 1000 generates new data from the control points of that solid data, and positions the control points in a manner of following the approximation curves of the paths. As a result, when the control points are located at different positions each time along the approximation curves, the number of control points may greatly increases.

However, with the embodiment described above, a flexible object such as a harness is divided by the control points that are set by the design verification apparatus 1000, and that data is given to the three-dimensional CAD system 300 in divided part units. Moreover, the three-dimensional CAD system 300 also returns the data to the design verification apparatus 1000 in similar part units. Then, the design verification apparatus 1000 can restore the flexible object by setting the control points again in part units, and integrating the parts by the processing described above. Therefore, the number of control points does not increase. Moreover, it is also possible to flexibly treat a joined state, inclusion relationship, bound state, branching and the like.

Therefore, it is possible to reduce the work involved in exchanging data between the design verification apparatus 1000 and three-dimensional CAD system 300, and thus it is possible to eliminate mistakes due to that work.

Furthermore, the intermediate file in a typical intermediate format is used when exchanging data between the design verification apparatus 1000 and the three-dimensional CAD system 300. Therefore, it is possible to exchange data with various kinds of three-dimensional CAD systems 300.

In the aforementioned explanation, an example of the harness was explained, however, a string or band-shaped object that is handled as a flexible object, or an object having a fixed cross section (such as a pipe) can also be handled.

In addition to a circular cross section, as long as the cross-sectional shape is a polygon of which a line segment connecting two points of the cross-sectional contour passes through the center, the side surfaces can be divided into two side surfaces, and this method can be applied.

Although the embodiment of this technique was explained above, this technique is not limited to this embodiment. For example, the functional block diagrams illustrated in FIGS. 1 and 2 are mere examples, and do not correspond to an actual program module configuration. Modules that carry out a processing shared with each processing unit may be prepared in advance, and each processing unit may call the modules.

Furthermore, the data format described above is a mere example, and as long as the similar data can be held, other data formats may be adopted.

Moreover, as for the processing flow, as long as the similar functions are realized, other processing flows may be adopted. Especially, as long as the processing results do not change, the order exchange of the steps or parallel execution may be adopted.

Incidentally, the three-dimensional CAD system 300 and design verification apparatus 1000 may respectively be implemented in different computers, and may be implemented in the same computer. Furthermore, each of them may be implemented in plural computers.

Figure 37:
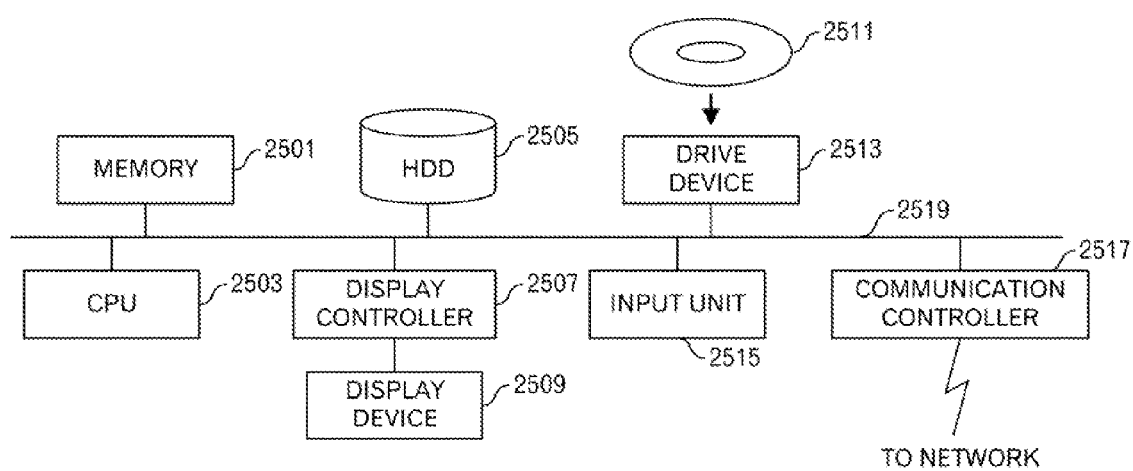
FIG. 37 is a functional block diagram of a computer.

In addition, the aforementioned three-dimensional CAD system 300 and design verification apparatus 1000 are computer devices as shown in FIG. 37. That is, a memory 2501 (storage device), a CPU 2503 (processor), a hard disk drive (HDD) 2505, a display controller 2507 connected to a display device 2509, a drive device 2513 for a removable disk 2511, an input device 2515, and a communication controller 2517 for connection with a network are connected through a bus 2519 as shown in FIG. 37. An operating system (OS) and an application program for carrying out the foregoing processing in the embodiment, are stored in the HDD 2505, and when executed by the CPU 2503, they are read out from the HDD 2505 to the memory 2501. As the need arises, the CPU 2503 controls the display controller 2507, the communication controller 2517, and the drive device 2513, and causes them to perform necessary operations. Besides, intermediate processing data is stored in the memory 2501, and if necessary, it is stored in the HDD 2505. In this embodiment of this technique, the application program to realize the aforementioned functions is stored in the computer-readable, non-transitory removable disk 2511 and distributed, and then it is installed into the HDD 2505 from the drive device 2513. It may be installed into the HDD 2505 via the network such as the Internet and the communication controller 2517. In the computer as stated above, the hardware such as the CPU 2503 and the memory 2501, the OS and the necessary application programs systematically cooperate with each other, so that various functions as described above in details are realized.

The aforementioned embodiment is summarized as follows:

A design support method relating to this embodiment includes: (A) first generating, from data stored in a first data storage unit storing data of a plurality of parts that are string-shaped or band-shaped parts formed by end surfaces and side surfaces, first data including control point candidate data for control point candidates within the end surfaces, end surface data defining the end surfaces and path candidate data for path candidates between the control point candidates, for each of the plurality of parts, and storing the first data into a second data storage unit; (B) second generating second data of continuous shape paths representing continuous parts by searching the first data for parts having same control point candidate data and same end surface data, and storing the second data into the second data storage unit; and (C) third generating third data including data of control points determined on end surface portion of the parts and data of paths between the control points for the continuous shape paths and a group of the continuous shape paths from the first data and the second data, and storing the third data into the second data storage unit.

By carrying out such a processing, the third data to handle the flexible object in the design verification apparatus is automatically generated. Therefore, it becomes possible to restore data from the three-dimensional CAD system in the design verification apparatus, and to reduce the designer's work.

Incidentally, the aforementioned third data may include data of continuous shape paths associated with the control points. Then, this method may include dividing the continuous shape paths into sections according to the data of the control points, which is included in the third data, to generate data of parts having end surfaces and side surfaces according to the third data for each of the sections and to store the generated data into the first data storage unit.

By carrying out such a processing, it becomes possible to convert the third data of the flexible object handled, for example, in the design verification apparatus to data of parts that can be processed, for example, in the three-dimensional CAD system. Namely, data exchange between the three-dimensional CAD system and the design verification apparatus becomes easy.

Furthermore, the third generating may include: identifying the group of the continuous shape paths by collecting and successively searching for a first continuous shape path and a second continuous shape path having an end surface included in an end surface of the first continuous shape path, and storing data for the group of the continuous shape paths into the second data storage unit. Thus, a state that plural wires are bundled by using a cover can be handled.

Moreover, the aforementioned third generating may include: calculating a position of a control point from at least a position of a control point candidate for the end surface of the first continuous shape path; and generating the data of the paths between the control points from the path candidate data for a plurality of continuous shape paths disposed between the control points. For example, the center of gravity of the control point candidates may be set to the position of the control point, and/or the average value of the path lengths included in the path candidate data may be set to data of the paths.

Furthermore, the aforementioned third generating may include: when, from the third data, a plurality of continuous shape paths, which are not included in the group of the continuous shape paths and have same layout, were detected, storing data to identifying the plurality of continuous shape paths into the second data storage unit. Like plural wires connected to a connector, the plural continuous shape path passing through the same path may be managed together.

Incidentally, the control point candidate data may include data representing a normal direction of the control point candidate. In such a case, the aforementioned identifying may include: searching for a third continuous shape path and a fourth continuous shape path that has a starting point end surface having the same normal direction and being on the same plane as those of the third continuous shape path, wherein the fourth continuous shape path has an ending point end surface having the same normal direction and being on the same plane as those of the ending point end surface of the third continuous shape path, to identify a group of continuous shape paths, and storing data of the group of the continuous shape paths into the second data storage unit.

Moreover, this method may further include: when, from the third data, a partial section that is included in a plurality of continuous shape paths, a plurality of groups of continuous shape paths or a combination of a continuous shape path and a group of continuous shape paths and has same layout is detected, generating, from data of control points included in the partial section, data of binding control points, and storing the generated data into the second data storage unit; and generating, from data of a path between control points included in the partial section, data of a path between the binding control points, and storing the generated data into the second data storage unit. For example, a case can be treated that plural wires that do not have inclusion relationship and are not covered by a cover is partially bundled.

Incidentally, it is possible to create a program causing a computer to execute the aforementioned processing, and such a program is stored in a computer readable storage medium or storage device such as a flexible disk, CD-ROM, DVD-ROM, magneto-optic disk, a semiconductor memory, and hard disk. In addition, the intermediate processing result is temporarily stored in a storage device such as a main memory or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A computer-readable, non-transitory storage medium storing a program for causing a design verification apparatus to execute a design verification process of a harness assembly, the design verification process comprising:
   obtaining, from a three-dimensional design apparatus, first data of a plurality of parts that represent one or more wires of one or more harness assemblies, wherein each of the plurality of parts is formed by end surfaces and side surfaces, and the plurality of parts are generated by the three-dimensional design apparatus;
   first generating, from the first data, second data including control point candidate data for control point candidates within the end surfaces, end surface data defining the end surfaces and path candidate data for path candidates between the control point candidates, for each of the plurality of parts;
   successively searching the plurality of parts for parts that have same control point candidate data and same end surface data;
   second generating, based on detected parts in the searching, a first list of parts for each of continuous shape paths, each of which represents one wire;
   searching the continuous shape paths for a first continuous shape path and a second continuous shape path that has an end surface included in an end surface of the first continuous shape path;
   third generating, based on detected first and second continuous shape paths, a second list of harness assemblies that include one or more continuous shape paths;
   fourth generating harness assembly data for each harness assembly listed in the second list by extracting, from the second data for the parts included in the first list for each of the continuous shape paths included in the harness assembly, the control point candidate data, the end surface data and the path candidate data to determine control points of the harness assembly and data regarding parts disposed between the control points, wherein the fourth generating comprises identifying a plurality of end surfaces of parts, which have a same attitude, and are on a same plane and are not included in any end surface of any other parts, to calculate a position of a control point for the identified plurality of end surfaces based on the control point candidate data for the identified plurality of end surfaces; and
   verifying a design of the one or more harness assemblies represented by the harness assembly data.

2. The computer-readable, non-transitory storage medium as set forth in claim 1, wherein the design verification process further comprises generating, from second harness assembly data that was processed by the design verification apparatus and includes second control points and data regarding parts disposed between the second control points, third data to be used in the three-dimensional apparatus by dividing one or more second continuous shape paths included in one or more second harness assemblies represented by the second harness assembly data into sections according to the second control points included in the second harness assembly data, wherein the third data includes data of parts having end surfaces and side surfaces for each of the sections.

3. The computer-readable, non-transitory storage medium as set forth in claim 1, wherein the design verification process further comprises searching the continuous shape paths for a plurality of continuous shape paths, which are other than the detected first and second continuous shape paths and have same layout.

4. The computer-readable, non-transitory storage medium as set forth in claim 1, wherein the design verification process further comprises:
   searching the harness assembly data for one or more sections that are included in a plurality of harness assemblies and have same layout; and
   generating, from control points included in detected one or more sections, data of binding control points.

5. A design verification method for a harness assembly, comprising:
   obtaining, by using a design verification apparatus, from a three-dimensional design apparatus, first data of a plurality of parts that represent one or more wires of one or more harness assemblies, wherein each of the plurality of parts is formed by end surfaces and side surfaces, and the plurality of parts are generated by the three-dimensional design apparatus;

first generating, by using the design verification apparatus, from the first data, second data including control point candidate data for control point candidates within the end surfaces, end surface data defining the end surfaces and path candidate data for path candidates between the control point candidates, for each of the plurality of parts;

successively searching, by using the design verification apparatus, the plurality of parts for parts that have same control point candidate data and same end surface data;

second generating, based on detected parts in the searching, by using the design verification apparatus, a first list of parts for each of continuous shape paths, each of which represents one wire;

searching, by using the design verification apparatus, the continuous shape paths for a first continuous shape path and a second continuous shape path that has an end surface included in an end surface of the first continuous shape path;

third generating, by using the design verification apparatus, based on detected first and second continuous shape paths, a second list of harness assemblies that include one or more continuous shape paths;

fourth generating, by using the design verification apparatus, harness assembly data for each harness assembly listed in the second list by extracting, from the second data for the parts included in the first list for each of the continuous shape paths included in the harness assembly, the control point candidate data, the end surface data and the path candidate data to determine control points of the harness assembly and data regarding parts disposed between the control points, wherein the fourth generating comprises identifying a plurality of end surfaces of parts, which have a same attitude, and are on a same plane and are not included in any end surface of any other parts, to calculate a position of a control point for the identified plurality of end surfaces based on the control point candidate data for the identified plurality of end surfaces; and verifying, by the design verification apparatus, a design of the one or more harness assemblies represented by the harness assembly data.

6. The design verification method as set forth in claim 5, further comprising generating, from second harness assembly data that was processed by the design verification apparatus and includes second control points and data regarding parts disposed between the second control points, third data to be used in the three-dimensional apparatus by dividing one or more continuous shape paths included in one or more second harness assemblies represented by the second harness assembly data into sections according to the second control points included in the second harness assembly data, the third data including data of parts having end surfaces and side surfaces for each of the sections.

7. The design verification method as set forth in claim 5, further comprising searching the continuous shape paths for a plurality of continuous shape paths, which are other than the detected first and second continuous shape paths and have same layout.

8. The design verification method as set forth in claim 5, further comprising:

searching the harness assembly data for one or more sections that are included in a plurality of harness assemblies and have same layout; and generating, from control points included in detected one or more sections, data of binding control points.

9. A design verification apparatus comprising:

a memory; and a processor configured to use the memory and execute a process comprising:

obtaining, from a three-dimensional design apparatus, first data of a plurality of parts that represent one or more wires of one or more harness assemblies, wherein each of the plurality of parts is formed by end surfaces and side surfaces, and the plurality of parts are generated by the three-dimensional design apparatus;

first generating, from the first data, second data including control point candidate data for control point candidates within the end surfaces, end surface data defining the end surfaces and path candidate data for path candidates between the control point candidates, for each of the plurality of parts;

successively searching the plurality of parts for parts that have same control point candidate data and same end surface data;

second generating, based on detected parts in the searching, a first list of parts for each of continuous shape paths, each of which represents one wire;

searching the continuous shape paths for a first continuous shape path and a second continuous shape path that has an end surface included in an end surface of the first continuous shape path;

third generating, based on detected first and second continuous shape paths, a second list of harness assemblies that include one or more continuous shape paths;

fourth generating harness assembly data for each harness assembly listed in the second list by extracting, from the second data for the parts included in the first list for each of the continuous shape paths included in the harness assembly, the control point candidate data, the end surface data and the path candidate data to determine control points of the harness assembly and data regarding parts disposed between the control points, wherein the fourth generating comprises identifying a plurality of end surfaces of parts, which have a same attitude, and are on a same plane and are not included in any end surface of any other parts, to calculate a position of a control point for the identified plurality of end surfaces based on the control point candidate data for the identified plurality of end surfaces; and verifying a design of the one or more harness assemblies represented by the harness assembly data.

10. The design verification apparatus as set forth in claim 9, wherein the process further comprises generating, from second harness assembly data that was processed by the design verification apparatus and includes second control points and data regarding parts disposed between the second control points, third data to be used in the three-dimensional apparatus by dividing the one or more second continuous shape paths included in one or more second harness assemblies represented by the second harness assembly data into sections according to the data of the control points included in the second harness assembly data, the third data including data of parts having end surfaces and side surfaces for each of the sections.

11. The design verification apparatus as set forth in claim 9, wherein the process further comprises searching the continuous shape paths for a plurality of continuous shape paths, which are other than the detected first and second continuous shape paths and have same layout.

12. The design verification apparatus as set forth in claim 9, wherein the process further comprises:
- searching the harness assembly data for one or more sections that are included in a plurality of harness assemblies and have same layout; and
- generating, from control points included in detected one or more sections, data of binding control points.

\* \* \* \* \*